United States Patent [19]
Katayama et al.

[11] Patent Number: 5,875,452
[45] Date of Patent: Feb. 23, 1999

[54] DRAM/SRAM WITH UNIFORM ACCESS TIME USING BUFFERS, WRITE BACK, ADDRESS DECODE, READ/WRITE AND REFRESH CONTROLLERS

[75] Inventors: Yasunao Katayama, Sagamihara; Akashi Sato, Yamato, both of Japan

[73] Assignee: International Business Machines Corporation, Armonk, N.Y.

[21] Appl. No.: 764,809

[22] Filed: Dec. 12, 1996

[30] Foreign Application Priority Data

Dec. 21, 1995 [JP] Japan .................................. 7-333652

[51] Int. Cl.[6] .................................................. G06F 12/00
[52] U.S. Cl. ............................ 711/105; 711/167; 365/233
[58] Field of Search .................................... 711/143, 105; 395/445, 562; 207/104

[56] References Cited

U.S. PATENT DOCUMENTS

| | | | |
|---|---|---|---|
| 5,184,320 | 2/1993 | Dye | 365/49 |
| 5,210,868 | 5/1993 | Shionada et al. | 307/104 |
| 5,247,643 | 9/1993 | Shoitay | 711/143 |
| 5,490,113 | 2/1996 | Tatosiay et al. | 365/189.05 |
| 5,598,545 | 1/1997 | Childers et al. | 395/562 |
| 5,721,862 | 2/1998 | Samtore et al. | 395/445 |

*Primary Examiner*—Tod R. Swann
*Assistant Examiner*—David Langjahr
*Attorney, Agent, or Firm*—Robert A. Walsh

[57] ABSTRACT

A DRAM is provided that can carry out data reads or writes in a constant and short access time regardless of the timing with which the reads or writes, or refreshing are executed. When requests for reads from or writes to burst data are continuously input, row decoding (RD) and column decoding (CD) by a row decoder 42 and a column decoder 52, an array access (AR) and precharging (PR) by a data line driver 24, a bit switch 26, and a sense amplifier 28, and data transfer (TR) by a write buffer 52 and a read buffer 54 are executed in parallel in a pipelined manner. When the time has come to refresh a DRAM array 22, a refresh address held in a refresh controller 40 is output while the burst data is being transferred, and a series of refreshing operations comprising (RD), (AR), and (PR) is performed.

18 Claims, 23 Drawing Sheets

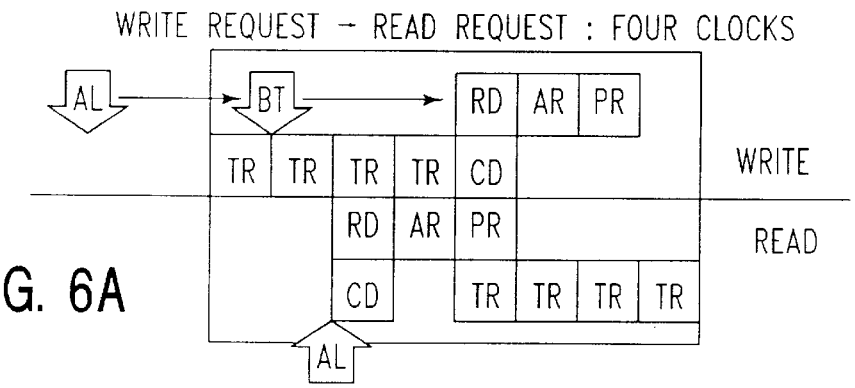
FIG. 6A
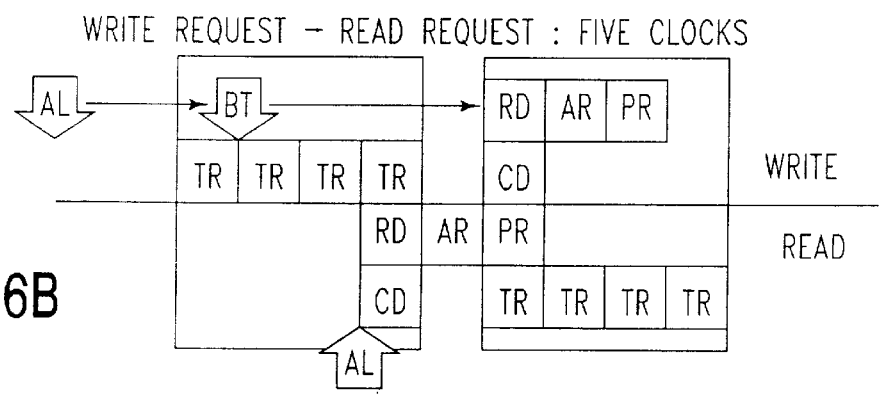
FIG. 6B
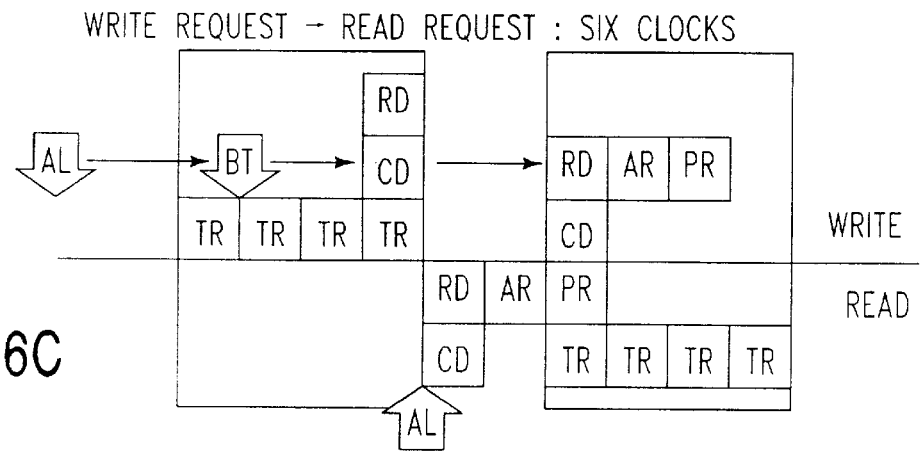
FIG. 6C
FIG. 6D

REFRESH REQUEST - READ REQUEST : ZERO CLOCK
(SIMULTANEOUSLY)

REFRESH REQUEST - READ REQUEST : ONE CLOCK

REFRESH REQUEST - READ REQUEST : TWO CLOCKS

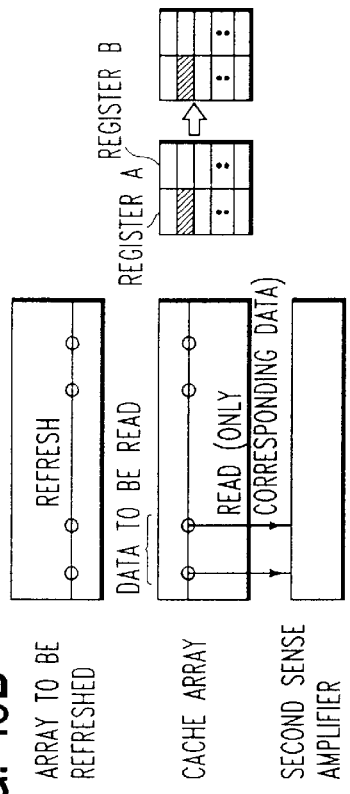
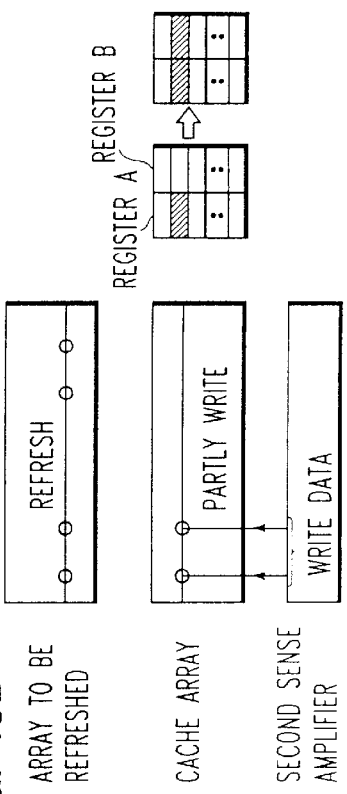
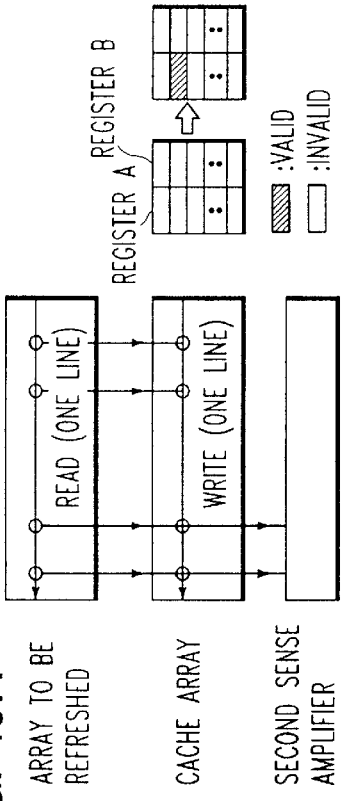
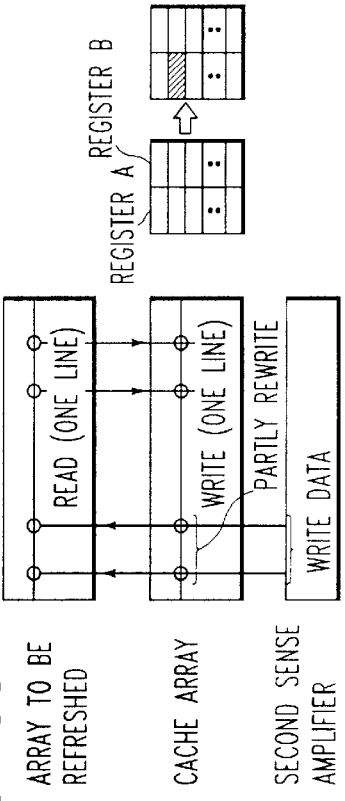

(ANOTHER EXAMPLE OF CASE IN WHICH WRITE TO ARRAY TO BE REFRESHED HAS BEEN REQUESTED)

WRITE IS REQUESTED BUT DATA IS NOT PRESENT IN CACHE ARRAY (WRITE MISS)

(CASE IN WHICH THERE IS A REQUEST FOR READ FROM OR WRITE TO ARRAY DIFFERENT FROM ARRAY TO WHICH DATA IS TO BE WRITTEN BACK)

(CASE IN WHICH READ FROM OR WRITE TO ARRAY TO WHICH DATA IS TO BE WRITTEN BACK HAS BEEN REQUESTED)
FIG. 19A  REQUEST FOR READ OF CLEAN DATA (READ CLEAN)
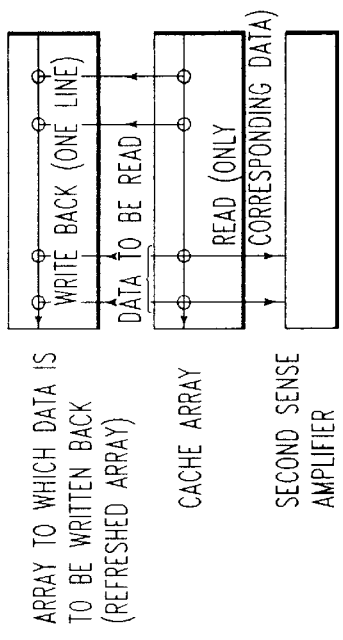
FIG. 19B  REQUEST FOR READ OF DIRTY DATA (READ DIRTY)
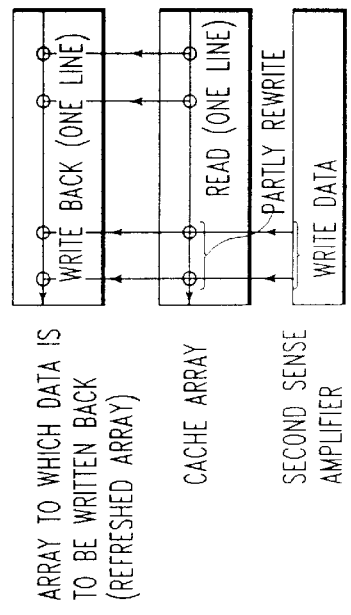
FIG. 19C  REQUEST FOR WRITE TO CLEAN DATA (WRITE CLEAN)
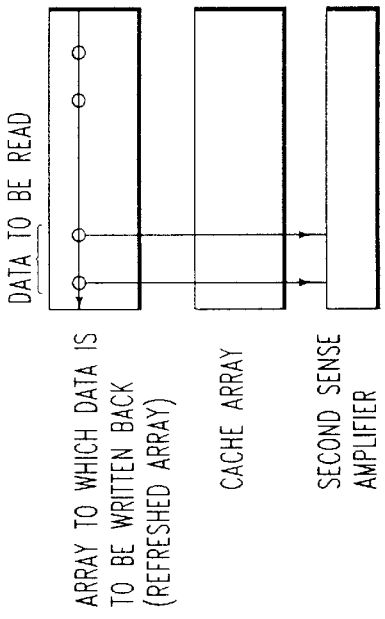
FIG. 19D  REQUEST FOR WRITE TO DIRTY DATA (WRITE DIRTY)
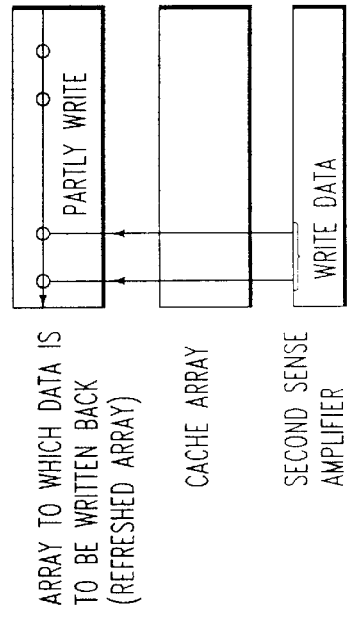

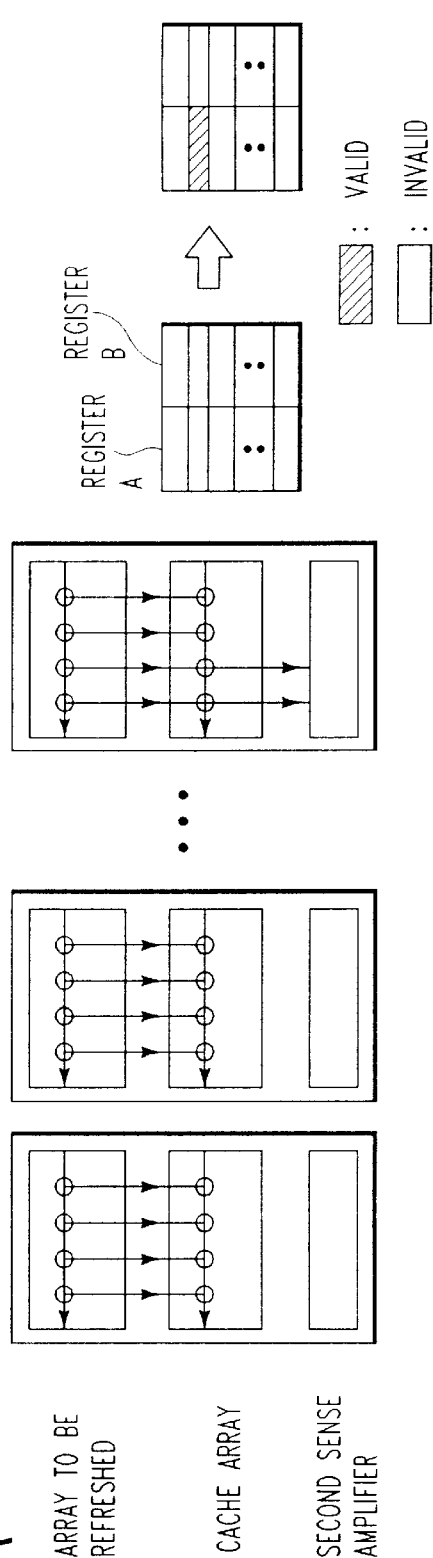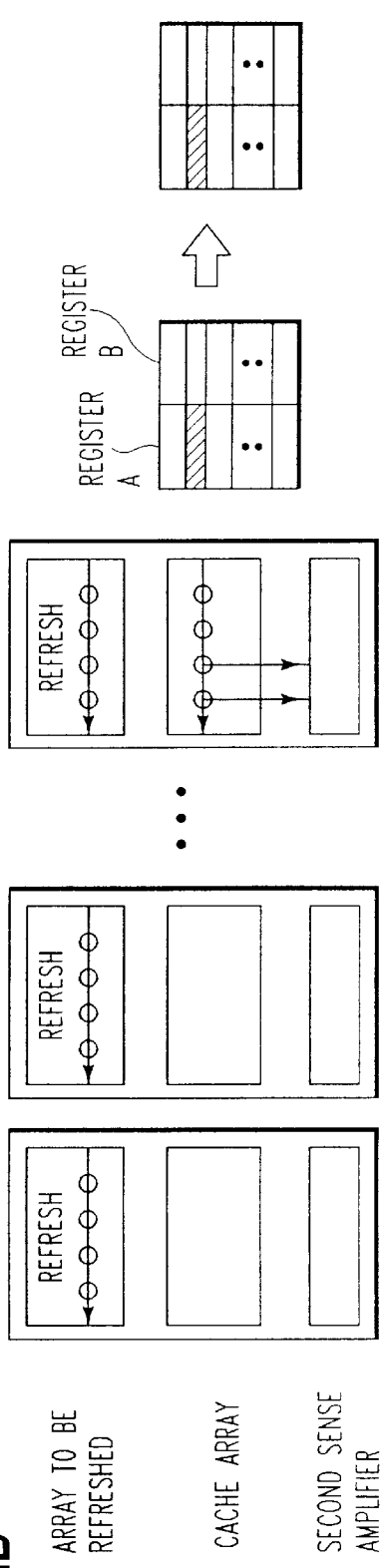

RD: ROW DECODING, CD: COLUMN DECODING,
AR: ARRAY ACCESS (DATA READ/WRITE), TR: DATA TRANSFER

DRAM/SRAM WITH UNIFORM ACCESS TIME USING BUFFERS, WRITE BACK, ADDRESS DECODE, READ/WRITE AND REFRESH CONTROLLERS

FIELD OF THE INVENTION

The present invention relates to a storage device and a method for controlling DRAMs, and in particular, to a DRAM controlling method for controlling data reads and writes from and to a DRAM array and its refreshing, and to a storage device to which the DRAM controlling method is applicable.

BACKGROUND OF THE INVENTION

DRAMs (Dynamic RAMs), which are one type of RAMs (Random Access read write Memories), have a lower operation speed than SRAMs (Static RAMs), but are widely used as main storage devices for computers that require a large storage capacity due to its low costs and high degree of integration. On the other hand, MPUs (Micro Processing Units) have much higher operation speed than DRAMs, and some recent MPUs have a significantly improved operation speed; that is, their internal clock has a frequency of 50 to 200 MHZ. Thus, the difference in the operation speeds of DRAMs and MPUs as main storage devices is becoming larger and larger.

Consequently, to reduce the probability that the MPU accesses a memory via an external bus of a relatively low speed which operates in synchronism with an external clock of a frequency half to one-fourth of that of the internal clock, a cache memory (a primary cache) comprising an SRAM is generally provided inside the MPU. Moreover, to also reduce the probability of accessing the main storage device upon a cache miss of the primary cache, another cache memory (a secondary cache) comprising an SRAM is provided outside the MPU. The storage capacity of the secondary cache is eight to sixty-four times as large as that of the primary cache.

If such cache memories are provided, the MPU mainly accesses the main storage device in the unit of a plurality of data blocks (data reads or writes). In recent years, more and more DRAMs with a burst mode (for example, synchronous DRAMs, DRAMs with a burst EDO mode, and DRAMs conforming to the Rambus' specification) in which burst data (data read from or written to the DRAM) comprising a plurality of continuous data blocks is continuously and sequentially transferred have been used to eliminate the difference in the performance of MPUs and conventional DRAMs and to efficiently transfer data between MPUs and DRAMs. The burst mode serves to improve the bus usage efficiency to enable data to be transferred at apparently high speeds. As a result, the costs and size of computers can be reduced by, for example, using a DRAM with a burst mode as a secondary cache instead of a SRAM or as a main storage device to omit the secondary cache.

In fact, however, the DRAM must be refreshed periodically and a synchronously relative to external accesses. Thus, when an interruption for refreshing (hereafter referred to as a "refresh interruption") is carried out, refreshing is preferentially executed, and external accesses from, for example, MPUs are forced to wait for a long time, resulting in inconstant access time (the time from the input of an external request for a data read or write until data read in response to the read request is transferred or a response to the write request is returned).

In addition, the bit line connected to the storage cell of the DRAM must be precharged before a data read or write is carried out. Thus, if an attempt is made to immediately read data that has just been written to the DRAM in response to an external request, it takes long before the data can be read due to the amount of time required to precharge the bit line (that is, a large amount of cycle time is required for a data read immediately after a data write), also resulting in long access time.

Although various DRAMs (described below in detail) are currently used, no such DRAMs are guaranteed to have a constant access time as in SRAMs, and their access time depends upon the access timing. It has thus been difficult to use a DRAM as a secondary cache instead of a SRAM or to omit the secondary cache.

For example, DRAMs with a cache memory comprising a SRAM (RAMTRON EDRAMs or other cache DRAMs) have a constant access time if external accesses hit the cache memory. In this case, the DRAM array can be refreshed because it is not accessed. If, however, external accesses fail to hit the cache memory, the DRAM array will be directly accessed, and the access time will be long if a refresh interruption occurs at this point of time.

In addition, when a refresh interruption occurs, synchronous DRAMs and DRAMs with a burst EDO (Extended Data Out) mode described above abort the operation of a burst mode to sequentially execute the precharging of the bit line, the input of refresh addresses, and refreshing, thereby forcing the burst data to wait for transfer for a long time. If an attempt is made to immediately read data that has just been written, the cycle time will be long due to the amount of time required to precharge the bit line, resulting in the need of long access time to carry out reads immediately after data writes.

DRAMs conforming to the specification of Rambus Co., Ltd. (hereafter referred to as "Rambus-specified DRAMs") are also known as other DRAMs with a burst mode. Rambus-specified DRAMs basically use a sense amplifier as a cache to perform a burst operation, and external accesses are executed by sending 60 bits of request packet. If a hit does not occur in the cache and if a refresh interruption is being performed, the request packet is not accepted, and the request packet must be repeatedly transmitted every 100 nsec until it is accepted. Accesses to Rambus-specified DRAMs thus involve a large overhead in transmitting packets, so they are not suitable for applications that use a burst operation to read or write relatively short data and are mainly used for graphic processing that requires fast sequential accesses.

Pseudo SRAMs are known as DRAMs that can be accessed within a constant time regardless of external access timing. The basic idea of pseudo SRAMs is that the time required for a single cycle of a read or a write operation is set at a larger value, that the DRAM array is not accessed for a specified period of time or longer within a single cycle of a read or a write operation, and that when a refresh interruption is directed, the refreshing operation is completed within the above period of time. Accesses to these SRAMs require a very large amount of time, so they cannot be used instead of SRAMs that have a high operation speed.

On the other hand, various DRAMs with a burst mode as described above have a reduced bus usage efficiency in reading or writing burst data spanning a plurality of pages (spanning a plurality of lines with different row addresses). To improve the bus usage efficiency in reading or writing burst data spanning a plurality of pages, the applicant has already proposed a storage device pipelined into three sections: a section for decoding input row and column addresses (a row predecoder, a column predecoder, a refresh controller, and a burst mode decoder), a section for accessing a DRAM array 98 (a row decoder, a column decoder, and a sense amplifier), and a section for transferring data (a line buffer), as shown in FIG. 23 (Japanese Patent Application No. 7-317926, filed on Dec. 6, 1995).

Even with these storage devices, however, data that has just been written cannot be read immediately, and a read operation must wait until the precharging of the bit line ("PR" in FIG. 24) has been completed, as shown in FIG. 24 (FIG. 24 shows a four bit burst wherein after two continuous reads, a write is carried out, immediately after which a read is again executed). The cycle time is thus two clock longer (the period shown as "Idle" in FIG. 24) than in normal accesses, resulting in increased access time and reduced bus usage efficiency. In addition, although not shown, as in conventional examples, when a refresh interruption is directed, accesses must wait until the refreshing operation has been completed, resulting in longer access time.

SUMMARY OF THE INVENTION

This invention is provided in view of the above facts, and its objective is to provide a storage device that enables data reads or writes in a constant and short access time regardless of the timing with which the data reads or writes are executed.

Another objective of this invention is to provide a DRAM controlling method that enables data reads or writes in a constant and short access time regardless of the timing with which the data reads or writes are executed.

To achieve the above objectives, a storage device according to this invention comprises a DRAM array including a large number of DRAM cells each connected to a bit line; a data buffer; a read/write controller operative upon an external request for a read or write of a specified size of data comprising a plurality of unit data from or to a specified area of the DRAM array, for reading the specified size of data from the specified area of the DRAM array via the bit line and holding it in the data buffer and sequentially transferring the read data to an external destination on a unit data basis, or sequentially holding in the data buffer the specified size of write data transferred from an external source on a unit data basis, and once the transfer of the write data has been completed, writing the write data to the specified area of the DRAM array via the bit line, and operative after each data read from or data write to the DRAM array for precharging the bit line while data is not being read from or written to the DRAM array; and a refresh controller operative upon the arrival of the time to refresh the DRAM array for refreshing the DRAM array and precharging the bit line while the read/write controller is not carrying out a read from or a write to the DRAM array or precharging the bit line.

According to the present invention, if a read of a specified size of data comprising a plurality of unit data (burst data) is requested, data read from the DRAM array is held in the data buffer and then sequentially transferred to the external destination on a unit data basis, while if a write of a specified size of data is requested, the specified size of write data transferred from the external source is sequentially held in the data buffer on a unit data basis, and once the transfer of the write data has been completed, the write data is written to the DRAM array. Thus, reads or writes from or to the DRAM array are not executed while data is being transferred between the data buffer and the external device.

According to this invention, based on the above characteristic, each time the read/write controller has read or written data from or to the DRAM array, it precharges the bit line while data is not being read from or written to the DRAM array, and when the time has come to carry out refreshing, the refresh controller refreshes the DRAM array and precharges the bit line while a data read from or a write to the DRAM array or the precharging of the bit line is not being executed.

Consequently, even if there are continuous requests for reads or writes of a specified size of data, the data reads or writes are prevented from waiting until the bit line has been precharged or refreshing has been executed upon the arrival of the time to execute refreshing. Thus, data can be read from or written to the DRAM array without externally determining whether or not refreshing is being carried out, and a specified size of data comprising a plurality of unit data can be read or written in a constant and short access time, regardless of the timing with which the read or write of the specified size of data is executed.

Specifically, the refresh controller can execute refreshing as follows. That is, this invention is characterized in that the refresh controller sequentially refreshes each area of the DRAM array, and in that when the time has come to execute refreshing, the refresh controller immediately refreshes a specified area of the DRAM array to be refreshed and precharges the bit line if the read/write controller does not carry out a data read from or a data write to the DRAM array or precharge the bit line within a specified period of time, whereas if the read/write controller carries out at least one of a data read and a data write and the precharging of the bit line within the specified period of time, the refresh controller holds the addresses of the specified area and refreshes the specified area and precharges the bit line based on the held addresses when the time has come when a data read from or a data write to the DRAM array or the precharging of the bit line is not executed.

In general, before data is actually read from or written to the DRAM array, the area from or to which data is read or written is examined (in particular, the input read or write addresses are decoded). Thus, it can be determined whether or not a data read from or a data write to the DRAM array is executed a specified period of time before it is actually carried out. In addition, since the bit line is precharged each time data has been read from or written to the DRAM array, it can be determined whether or not the precharging of the bit line to the DRAM array will be executed a specified period of time before it is actually carried out.

According to the present invention, the refreshing of a specified area of the DRAM array to be refreshed and the precharging of the bit line are immediately executed if the read/write controller does not carry out a data read from or a data write to the DRAM array or precharge the bit line within a specified period of time, whereas if the read/write controller carries out at least one of a data read and a data write to the DRAM array and the precharging of the bit line within the specified period of time, the addresses of the specified area to be refreshed are held, and the refreshing of the specified area and the precharging of the bit line are executed based on the held addresses when the time has come when a data read from or a data write to the DRAM array or the precharging of the bit line is not executed. This prevents data reads or writes from waiting due to the execution of refreshing regardless of the timing with which the reads or writes are carried out.

The present invention is also characterized in that the storage device further includes an address buffer for saving addresses; and a read and a write buffers separately provided as the data buffer, and in that when a data write is carried out, the read/write controller saves in the address buffer the addresses of an area to which the data is written and holds in the write data buffer write data sequentially transferred from the external source on a unit data basis, and in that if a data read is externally requested at the same time when or before the transfer of write data from the external source is completed, the data is read from the DRAM array and held in the read buffer, and while read data is being sequentially transferred to the external destination on a unit data basis or when the next request is a data write, the write data is written to the DRAM array based on the addresses saved in the address buffer.

In general, during a data read cycle, data is transferred after a read from the DRAM array has been finished, whereas during a data write cycle, a write to the DRAM array is carried out after data has been transferred. With conventional storage devices that store data in the DRAM array, if an external request for a data write is followed by a data read, a read cycle cannot be initiated before the bit line has been precharged for a data read after the write cycle has been finished. Even if burst data comprising a plurality of unit data is to be read or written, there is a large time interval between the write cycle and the read cycle due to the execution of the precharging of the bit line, thereby delaying the timing with which the transfer of read data is initiated in response to an external request for a data read and degrading the bus usage efficiency.

The present invention thus includes an address buffer for saving addresses and a read and a write buffers separately provided as the data buffer. When a data write is carried out, the addresses of an area to which the data is written are saved in the address buffer, and if a data read is externally requested at the same time when or before the transfer of write data from the external source is completed, the read data according to the read request is executed prior to the write of the write data to the DRAM array using the read buffer. Consequently, even if an external request for a data read follows a data write, the timing with which the transfer of read data is initiated in response to the external data read request is prevented from being delayed.

In addition, the write data is held in the write data buffer and the addresses of the area to which data is written are saved in the address buffer until a data write is carried out, and while the read data is being sequentially transferred to the external destination on a unit data basis or when the next request is a data write, the write data is written to the DRAM array based on the saved addresses and the bit line is precharged by the precharge controller. Thus, if a data write is subsequently requested, the processing for the previously requested data write can be completed at least before the subsequent data write must be processed.

According to the present invention, if an external request for a data read follows a request for a data write, the data read from the DRAM array is executed first. If, however, the write address of the write request and the read address of the read request are the same and the data read is carried out first, then the data will be read without being subjected to a write of the data to be written to the first data according to the previously requested write, resulting in the inconsistency of the data.

Thus, according to the present invention, when a data write is executed, if a data read is externally requested at the same time when or before the transfer of write data from the external source is completed, or if a data read is externally requested while the write data that has not been written to the DRAM array yet is held in the write data buffer and the addresses of the write and read are the same, the write data held in the write data buffer is transferred to the external destination by the read/write controller as read data.

According to the present invention, when a data write is executed, if a data read is externally requested at the same time when or before the transfer of write data from the external source is completed, or if a data read is externally requested while the write data that has not been written to the DRAM array yet is held in the write data buffer and the addresses of the write and read are the same, the write data held in the write data buffer is transferred to the external destination as read data. As a result, the read data will not be inconsistent if a data read from and a data write to the same address are continuously requested or, as described above, if a data read from the same address to which write data is to be written is requested while the write data is held in the write data buffer to provide for a next request for a data write.

The storage device according to the present invention can be configured as follows. That is, this invention is characterized in that both the read/write controller and the refresh controller use the same address decode section for decoding the addresses of an area from or to which data is read or written or which is to be refreshed and the same array access section for reading or writing data from or to the specified area of the DRAM array corresponding to the addresses decoded by the address decode section, refreshing the specified area, or precharging the bit line of the DRAM array, in that the read/write controller includes a data transfer section including the data buffer for transferring data between the data buffer and the external device, and in that the address decode section, the array access section, and the data transfer section can be operated in parallel.

According to the present invention, the address decode section, the array access section, and the data transfer section can be operated in parallel. Thus, for example, while the data transfer section is transferring data in response to a predetermined read or write request, the address decode or the array access section can execute processing in response to another read or write request. Consequently, if there are continuous requests for reads or writes of a specified size of data comprising a plurality of unit data, the precharging of the bit line to the DRAM array or the refreshing of the DRAM array can be executed while data is not being read from or written to the DRAM array.

A method for controlling DRAMs according to the present invention is operative upon an external request for a read or a write of a specified size of data comprising a plurality of unit data from or to a specified area of a DRAM array comprising a large number of DRAM cells each connected to a bit line, for reading the specified size of data from the specified area of the DRAM array via the bit line, holding it in the data buffer, and sequentially transferring the read data from the data buffer to the external destination on a unit data basis, or sequentially holding in the data buffer the specified size of write data sequentially transferred from the external source on a unit data basis and once the transfer of the write data has been completed, writing the write data to the specified area of the DRAM array from the data buffer via the bit line, and operative each time data is read from or written to the DRAM array, for precharging the bit line while data is not being read from or written to the DRAM array, wherein when the time has come to refresh the DRAM array, the refreshing of the DRAM array and the precharging of the bit line are carried out while data is not being read from or written to the DRAM array or the bit line is not being precharged.

According to the present invention, the bit line to the DRAM array is precharged while data is not being read from or written to the DRAM array. In addition, when the time has come to carry out refreshing, the DRAM array is refreshed while a data read from or a data write to the DRAM array or the precharging of the bit line is not being executed. Thus, as in the described storage device, even if there are continuous requests for reads or writes of a specified size of data, the data reads or writes are prevented from waiting until the precharging of the bit line or refreshing has been carried out upon the arrival of the time to execute refreshing. Reads or writes of a specified size of data comprising a plurality of unit data can be executed in a constant and short access time regardless of the timing with which the reads or writes of the specified data are carried out.

The storage device according to the present invention comprises a DRAM array including a large number of DRAM cells; a storage means; a refresh controller operative upon the arrival of the time to refresh the DRAM array for refreshing the DRAM array while data is not being read from or written to the DRAM array; a read/write controller operative upon an external request for a data read from or a data write to a specified area of the DRAM array being refreshed by the refresh controller, for reading data from the specified area of the DRAM array, transferring to the external destination the data read from the specified area, and storing it in the storage means, or using write data transferred from the external source to rewrite the data read from the specified area and storing the rewritten data in the storage means if the data corresponding to the specified area of the DRAM array is not stored in the storage means, and if the data corresponding to the specified area of the DRAM array is stored in the storage means, executing a read or a write of the data stored in the storage means and corresponding to the specified area; and a write back controller for writing back the data stored in the storage means to the corresponding area of the DRAM array after the refreshing of the DRAM array by the refresh controller has been completed.

According to the present invention, when a single read from or a write to a specified area of the DRAM array being refreshed is requested, the data corresponding to the specified area (the same data as stored in the specified area of the DRAM or the data stored in the specified area but rewritten with write data) is stored in the storage means. As a result, if a read from or a write to the specified area of the DRAM array being refreshed is again requested, a read or write is executed on the data stored in the storage means and corresponding to the specified area of the DRAM array, whereas a data read from or a data write to the DRAM array is not carried out.

The refresh controller refreshes the DRAM array while data is not being read from or written to the DRAM array. If, however, there occur a plurality of requests for data reads from or data writes to the same area of the DRAM array to be refreshed, then during the second or subsequent requests, a read from or a write to the data stored in the storage means are executed to enable the DRAM array to be refreshed during this period of time.

In addition, if only a write to the data stored in the storage means is carried out, the data stored in the DRAM array will not match the corresponding data stored in the storage means. Once the refreshing of the DRAM array has been completed, however, the write back controller writes back the data stored in the storage means to the corresponding area of the DRAM array, thereby preventing the mismatch of the data.

Thus, even if a data read from or a data write to the DRAM array being refreshed is requested, the data read or write is prevented from waiting until refreshing has been carried out, and reads or writes of data (which may be unit data or of a specified size comprising a plurality of unit data) from or to the DRAM array can be executed without externally knowing whether or not refreshing is being carried out. As a result, reads or writes of not only burst data comprising a plurality of unit data but also unit data can be executed in a constant and short access time regardless of the timing with which the reads or writes of the specified data are carried out.

Which area of the DRAM array being refreshed is indicated by a data read or write request is unspecified, and any area of the DRAM array being refreshed may be specified by the request. In view of this point, the storage means preferably comprises a semiconductor memory of the same storage capacity as a single DRAM array.

The present invention is also characterized in that the DRAM array comprises a large number of DRAM cells arranged in a matrix, in that if the data corresponding to that area of the DRAM array which has been specified by a read or a write request is not stored in the storage means, write data transferred from the external source is used to rewrite all or part of the data read from a DRAM cell column including the specified area in order to store the rewritten data in the storage means by the read/write controller, and in that the write back controller writes back the data stored in the storage means to the DRAM array for each DRAM cell column.

The DRAM array generally comprises a large number of DRAM cells arranged in a matrix and each connected to a bit line via a word line. The DRAM array of this configuration is refreshed on the basis of a DRAM cell column connected to a bit line via the same word line. In addition, data is read from the DRAM array of this configuration by precharging the bit line, driving the word lines corresponding to read addresses to amplify signals (corresponding to the data stored in each DRAM cell) each output from the DRAM cell column to the bit line, outputting those signals from the DRAM cells which correspond to the read addresses, and writing back the amplified signals to the DRAM cell column.

Furthermore, data is written to the DRAM array of this configuration by precharging the bit line, driving the word lines corresponding to write addresses to amplify signals each output from the DRAM cell column to the bit line, changing, according to the write data, the level of those amplified signals from the DRAM cells which correspond to the write addresses, and writing back these signals to the DRAM cell column. In this manner, the DRAM array comprising a large number of DRAM cells arranged in a matrix is accessed on a DRAM cell column basis when a data read or write or precharging is carried out.

According to the present invention, however, if the data corresponding to that area of the DRAM array which is specified by a read or a write request is not stored in the storage means, write data transferred from the external source is used to rewrite all or part of the data read from a DRAM cell column including the specified area in order to store the rewritten data in the storage means, and the write back controller writes back the data stored in the storage means to the DRAM array for each DRAM cell column. Consequently, compared to the use of a unit smaller than a DRAM cell column to store or write back data in or to the storage means, this invention improves the probability that the data corresponding to the specified area of the DRAM array is stored in the storage means when a read from or a write to the specified area of the DRAM array is requested, without increasing the number of accesses to the DRAM array.

This also facilitates the determination of whether or not the data corresponding to that area of the DRAM array which is specified by a read or a write request is stored in the storage means (if first identification information described below is used to make this determination, the amount of this information is reduced).

The present invention is also characterized in that the number of storage cells in the storage means constituting a single storage cell column is the same as the number of DRAM cells constituting a single DRAM cell column of the DRAM array, and in that the number of the storage cell columns is the same as the number of the DRAM cell columns of the DRAM array.

According to the present invention, the numbers of storage cells in the storage means constituting a single storage cell column and of the storage cell columns are the same as the numbers of DRAM cells constituting a single DRAM cell column of the DRAM array and of the DRAM cell columns. Each storage cell column of the storage means can thus have the same address as each DRAM cell column of the DRAM array. Consequently, when data is stored in the storage means, it can be stored in the storage cell column with the same address as the DRAM cell column from which the data has been read, or when data is written back from the storage means to the DRAM array, the data stored in a specified storage cell column can be written back to the DRAM cell column with the same address as this storage cell column. This enables data writes and write backs to the storage means to be carried out easily.

According to the present invention, it is preferable that the storage device has a plurality of the DRAM arrays, and that the refresh controller sequentially refreshes each of the plurality of DRAM arrays.

The present invention is also characterized in that the storage device further has a write back line for writing back data from the storage means to the DRAM array.

With a plurality of DRAM arrays, when data is being read from or written to a DRAM array, the signal line for transferring data read from the DRAM or written thereto is occupied, so the write back controller cannot easily write back the data stored in the storage means to the corresponding area of the DRAM array. The present invention, however, includes the write back line to enable the write back controller to write back data even if the signal line for transferring data read from the DRAM array or written thereto is occupied.

The present invention is also characterized in that if there occurs an external request for a data write to a specified area of the DRAM array being refreshed by the refresh controller and the data corresponding to the specified area of the DRAM array is not stored in the storage means, then the data is read from the specified area of the DRAM array by read/write controller and the data read from the specified area is rewritten using write data transferred from the external source in order to store the rewritten data in the storage means and to write it to the specified area of the DRAM array.

According to the present invention, if there occurs an external request for a data write to a specified area of the DRAM array being refreshed by the refresh controller and the data corresponding to the specified area of the DRAM array is not stored in the storage means, then the data is read from the specified area of the DRAM array and the data read from the specified area is rewritten using write data transferred from the external source in order to store the rewritten data in the storage means and to write it to the specified area of the DRAM array. This can prevent the mismatch between the data stored in the DRAM array and the corresponding data stored in the storage means, and reduce the amount of that data stored in the storage means which does not match the data stored in the DRAM array (dirty data described below).

If there occurs a request for a data read from or a data write to a specified area of the DRAM array being refreshed by the refresh controller, the read/write controller can determine whether or not the data corresponding to the specified area is stored in the storage means as follows.

That is, the present invention is characterized in that if the read/write controller has read or written data from or to the DRAM array being refreshed by the refresh controller, it stores a first identification information for identifying that area of the DRAM area from or to which data has been read or written to determine whether or not data to be read from or written to a specified area is stored in the storage means, based on the first identification information.

The first identification information in the present invention can comprise, for example, the address of that area of the DRAM array from or to which data has been read or written. The amount of the first identification information, however, can be reduced by employing one bit information that is provided for each data written to the storage means (for each DRAM cell column if data is written to the storage means for each DRAM cell column, as described above) and which is required at a minimum to determine whether a data read or write has been executed.

If the read/write controller does not store second identification information described below, the write back controller can carry out write backs of all the data stored in the storage means, based on the first identification information, as a result of reads or writes by the read/write controller, and clear the first identification information after the completion of the write back.

If the storage device has a plurality of DRAM arrays as described above, and if the read/write controller is reading or writing data from or to a DRAM array that is different from the DRAM array to be refreshed, the refresh controller preferably refreshes the DRAM array to be refreshed.

If the storage device has, for example, (s) (s≧2) DRAM arrays, the probability that reads or writes of data of a particular DRAM array to be refreshed are requested is 1/s on average even if the reads or writes are continuous by requested. As described above, refreshing is executed if the read/write controller is executing a read from or write to another DRAM array, thereby enabling the refreshing of the DRAM array to be completed in a shorter period of time.

The present invention is also characterized in that if the refresh controller and the read/write controller attempt with the same timing to refresh the specified area of the DRAM array and to carry out a data read or write, respectively, then the read/write controller reads or writes data from or to the specified area of the DRAM array, and the refresh controller omits the refreshing of the specified area of the DRAM array.

According to the present invention, even if the refresh controller and the read/write controller attempt with the same timing to refresh the specified area of the DRAM array and to carry out a data read or write, respectively, the refreshing of the specified area is omitted. This saves wasteful power consumption and enables the refreshing of the DRAM array to be completed in a shorter period of time.

Based on the first identification information, the write back controller can execute write backs from the storage means to the DRAM array of all the data stored in the storage means as a result of reads or writes by the read/write controller. Write backs are preferably carried out as follows.

That is, the present invention is characterized in that if the read/write controller has executed a write only to data stored in the storage means, it stores second identification information for identifying the dirty data occurring due to the write, and in that the write back controller then writes back only the dirty data to the corresponding area of the DRAM array based on the second identification information.

According to the present invention, only the dirty data written only to the storage means by the read/write controller, that is, the data that does not match the corresponding data stored in the DRAM array is written back, thereby reducing the amount of data to be written back and enabling write backs from the storage means to the DRAM array to be completed in a shorter period of time by the write back controller.

If the write back controller writes back dirty data based on the second identification information, as described above, the write back controller clears the second identification information after writing back the dirty data based on this identification information.

In addition, if the read/write controller has read or written data from or to the DRAM array being refreshed by the refresh controller as described above, it stores first identification information for identifying that area of the DRAM array from or to which data has been read or written to determine whether or not the data in the specified area to which the read or write has been executed is stored in the storage means based on the first identification information. If only a write to data stored in the storage means has been carried out, and if the second identification information is stored to identify the dirty data occurring due to this write, the read/write controller can clear the first identification information if the refreshing of the DRAM array to be refreshed has been completed and even before the write back controller has not completed the write back of the dirty data to the DRAM array to be refreshed.

The present invention is also characterized in that the refresh controller omits the refreshing of those unrefreshed areas of the DRAM array from or to which data has been read or written, based on the first identification information.

As described above, if data has been read from or written to the specified area of the DRAM array, the data is written back to the specified area, and this has the same effects as the case in which the specified area of the DRAM cell has been refreshed. Based on this characteristic, the above invention omits the refreshing of those unrefreshed areas of the DRAM array from or to which data has been read or written, based on the first identification information for identifying that area of the DRAM array from or to which data has been read or written. This saves wasteful power consumption due to the refreshing of areas from or to which data has been read or written, and enables refreshing to be completed in a shorter period of time.

If the storage device has a plurality of DRAM arrays as described above, and also has a write back line, and if the read/write controller is reading or writing data from or to a DRAM array that is different from the DRAM array to which data is to be written back, the write back controller preferably uses the write back line to execute a write back to the DRAM array to which data is to be written back.

If the storage device has, for example, (s) (s≧2) DRAM arrays, the probability that reads or writes of data of a particular DRAM array to which data is to be written back are requested is 1/s on average even if the reads or writes are continuously requested. As described above, the write back is executed if the read/write controller is executing a read from or write to another DRAM array, thereby enabling the write back controller to complete the write backs of the data from the storage means to the DRAM array to be completed in a shorter period of time.

The present invention is also characterized in that if the data corresponding to that area of the DRAM array which has been specified by a data read request is stored in the storage means as the data to be written back by the write back controller, the read/write controller reads from the storage means the data to be written back, and the write back controller writes back the data to be written back from the storage means to the DRAM array in the same cycle in which the read/write controller reads from the storage means the data to be written back.

According to the present invention, if the data corresponding to that area of the DRAM array which has been specified by a data read request is stored in the storage means as the data to be written back, the write back data is read from the storage means, and written back. Thus, even if the data read request specifies the DRAM array to which data is to be written back, the data read and the write back of the data to be written back are executed in parallel if the area specified by the read request is the same as the area to which the data is to be written back. This enables the write back controller to complete write backs of data from the storage means to the DRAM array in a shorter period of time.

The present invention is also characterized in that if the data corresponding to that area of the DRAM array which has been specified by a data write request is stored in the storage means as the data to be written back by the write back controller, the read/write controller executes a write to the data to be written back which is stored in the storage means, and the write back controller writes back the data to be written back on which the write has been executed by the read/write controller, from the storage means to the DRAM array in the same cycle in which the read/write controller writes the data.

According to the present invention, if the data corresponding to that area of the DRAM array which has been specified by a data write request is stored in the storage means as the data to be written back, a write to the data to be written back which is stored in the storage means is carried out, and the data to be written back on which the write has been executed is written back. Thus, even if the data write request specifies the DRAM array to which data is to be written back, the data write and the write back of the data to be written back are executed in parallel if the area specified by the write request is the same as the area to which the data is to be written back. This enables the write back controller to complete write backs of data from the storage means to the DRAM array in a shorter period of time.

The present invention is also characterized in that if the time has come to refresh a DRAM array that is different from the DRAM array to which data is to be written back before the write back to the latter DRAM array by the write back controller has been finished, then the write back controller uses the write back line to write back the data to the DRAM array to which the data is to be written back while the read/write controller is not reading or writing data from or to this DRAM array, and the refresh controller refreshes the DRAM array to be refreshed while the read/write controller is not reading or writing data from or to this DRAM array.

If the time has come to refresh a DRAM array that is different from the DRAM array to which data is to be written back before the write back to the latter DRAM array has been finished, the storage means has not been relieved and cannot be used to refresh the DRAM array to be refreshed. The above invention, however, has a plurality of DRAM arrays, and a write back is executed while data is not being read from or written to the DRAM array to which data is to be written back, whereas refreshing is carried out while data is not being read from or written to the DRAM array to be refreshed. This enables the execution of at least one of a write back and refreshing.

In addition, if there are continuous requests for reads from or write to the same area of the DRAM array to which data is to be written back, a write back of data to the DRAM array to which the data is to be written back cannot be carried out, but instead the DRAM array to be refreshed can be refreshed without using the storage means. In addition, if there are continuous requests for read from or write to the same area of the DRAM array to be refreshed, the DRAM array to be refreshed cannot be refreshed, but instead data can be written back to the DRAM array to which the data is to be written back. Once the write back has been completed, the storage means is relieved to enable refreshing to be executed using the storage means according to this invention. The refreshing of that area of the DRAM array to be refreshed from or to which data is being read or written can be omitted.

In this manner, if the time has come to refresh a DRAM array that is different from the DRAM array to which data is to be written back before the write back to the latter DRAM array has been finished, the DRAM array to be refreshed can be reliably refreshed according to the above invention.

According to the present invention, the storage means preferably comprises SRAMs. However, it may comprises a DRAM array. If the storage means comprise a DRAM array, however, the storage means must also be refreshed.

Thus, the present invention is characterized in that the storage means comprises a DRAM array, in that if the time has come to refresh the storage means, and data to be written back to the corresponding DRAM array to which data is to be written back is stored in the storage means, then the refresh controller refreshes the storage means during a period of time when data is not being read from or written to the storage means, and in that if there occurs a request for a data read from or a data write to that specified area of the DRAM array to which data is to be written back and the data corresponding to the specified area is stored in the storage means as the data to be written back, the read/write controller reads from the storage means the data to be written back, transfers the read data to the external destination, and writes it to the specified areas of the DRAM array to which the data is to be written back, or uses write data transferred from the external source to rewrite the read data in order to write the rewritten data to the DRAM array to which the data is to be written back.

According to the present invention, if the storage means has stored therein data to be written back to the DRAM array when it is to be refreshed, the refresh controller refreshes the storage means while data is not being read from or written to the storage means.

If, for example, the storage device has a plurality of DRAM arrays, and if there occurs a request for a data read from or a data write to a DRAM array that is different from the DRAM array to which data is to be written back, the refresh means can refresh the storage means while data is being read from or written to the former DRAM array. In addition, if there occurs a request for a data read from or a data write to a specified area of the DRAM array to which data is to be written back, and if the data corresponding to the specified area is not stored in the storage area as the data to be written back, the refresh controller can refresh the storage means while data is being read from or written to the specified area of the DRAM array to which the data is to be written back because the data stored in the specified area of this DRAM array is the latest.

In addition, if there occurs a request for a data read from or a data write to a specified area of the DRAM array to which data is to be written back, and if the data corresponding to the specified area is stored in the storage area as the data to be written back, the read/write controller reads from the storage means the data to be written back, transfers the read data to the external destination, and writes it to the specified areas of the DRAM array to which the data is to be written back, or uses write data transferred from the external source to rewrite the read data in order to write the rewritten data to the specified area of the DRAM array to which the data is to be written back. This enables the write back of the data to be written back which is stored in the storage means.

As described above, the present invention enables the storage means to be reliably refreshed even if it comprises a DRAM array. If the storage means does not have stored therein data to be written back to the DRAM array when it is to be refreshed, the above processing need not be executed because there will be no problem if the data stored in the storage means is lost.

A method for controlling DRAMs wherein a storage device is provided, wherein if the time has come to refresh a DRAM array comprising a large number of DRAM cells, then the DRAM array is refreshed while data is not being read from or written to the DRAM array, wherein when there occurs an external request for a data read from or a data write to a specified area of the DRAM array being refreshed, and if the data corresponding to the specified areas of the DRAM array is not stored in the storage means, then the data is read from the specified area of the DRAM array to transfer the read data to the external destination and to store it in the storage means, or write data transferred from the external source is used to rewrite the read data in order to store the rewritten data in the storage means, whereas if the data corresponding to the specified areas of the DRAM array is stored in the storage means, a read or a write is executed on the data corresponding to the specified areas of the DRAM array and stored in the storage means, and wherein after the refreshing of the DRAM array has been completed, the data stored in the storage means is written back to the corresponding area of the DRAM array.

According to the present invention, when a single read from or a write to a specified area of the DRAM array being refreshed is requested, the data corresponding to the specified area is stored in the storage means. Thus, if a read from or a write to this specified area of the DRAM array being refreshed is again requested, a read or write is executed on the data corresponding to the specified area of the DRAM array and stored in the storage means, whereas a data read from or a data write to the DRAM array is not carried out. The DRAM array is refreshed while data is not being read from or written to the DRAM array. If, however, there occur a plurality of requests for data reads from or data writes to the same specified area of the DRAM array to be refreshed, then during the second and subsequent requests, only a read from or a write to the data stored in the storage means is executed to enable the DRAM array to be refreshed during this period of time.

If only a write to the data stored in the storage means, the data stored in the DRAM array will not match the corresponding data stored in the storage means. Once the refreshing of the DRAM array has been completed, however, the data stored in the storage means is written back to the corresponding area of the DRAM array, thereby preventing the mismatch of the data.

Thus, even if a data read from or a data write to the DRAM array being refreshed is requested, the data read or write is prevented from waiting until refreshing has been carried out, and reads or writes of data from or to the DRAM array can be executed without externally knowing whether or not refreshing is being carried out. As a result, data reads or writes can be executed in a constant and short access time regardless of the timing with which the reads or writes are carried out.

BRIEF DESCRIPTION OF THE DRAWINGS

Embodiments of this invention are described below with reference to the drawings.

FIGS. 6(A), (B), (C), and (D) are timing charts showing the processing executed when a data read request is input four, five, six, and seven clocks after the input of a data write request, respectively;

FIGS. 16(A) to (D) are schematic drawings describing the processing executed when a data read from or data write to an array to be refreshed is requested;

FIGS. 19(A) to (D) are schematic drawings describing the processing executed when a data read from or data write to an array to which data is to be written back is requested;

FIGS. 21(A) to (D) are schematic drawings describing the case in which a data read from or a data write to a particular array requested when a plurality of arrays are collectively refreshed;

DESCRIPTION OF THE PREFERRED EMBODIMENT

Figure 1:
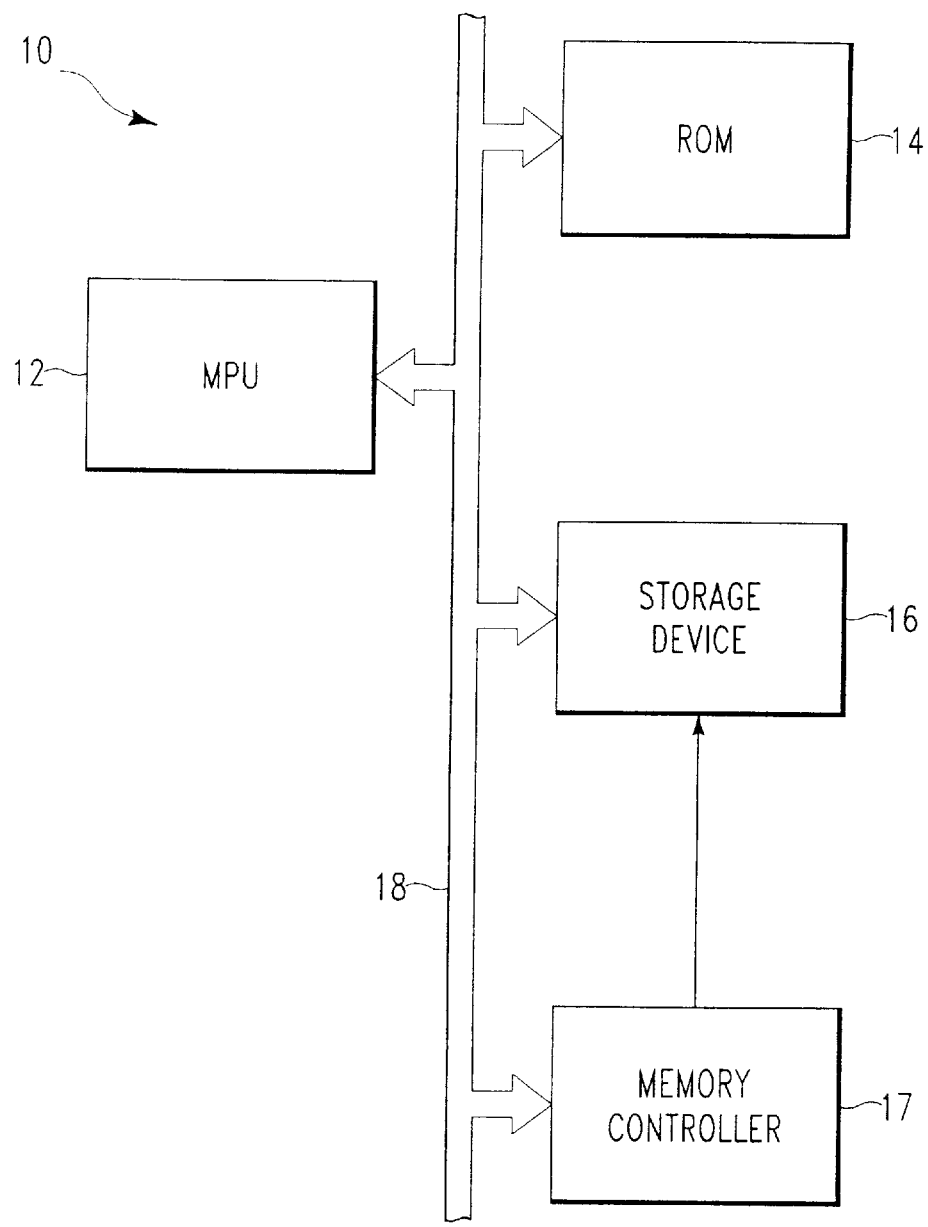
FIG. 1 is a block diagram showing an approximate configuration of a computer including a storage device according to the present invention.

FIG. 1 shows (part of) the configuration of a microcomputer 10 according to a first embodiment of this invention. The microcomputer 10 comprises an MPU 12, a ROM 14, a storage device 16 according to this invention, and a memory controller 17 connected to the storage device 16 for controlling the operation of the storage device 16, and these devices are connected together via a bus 18 comprising an address bus, a data bus, and a control bus. The storage device 16 is used as a main storage device for the microcomputer 10.

Figure 2:
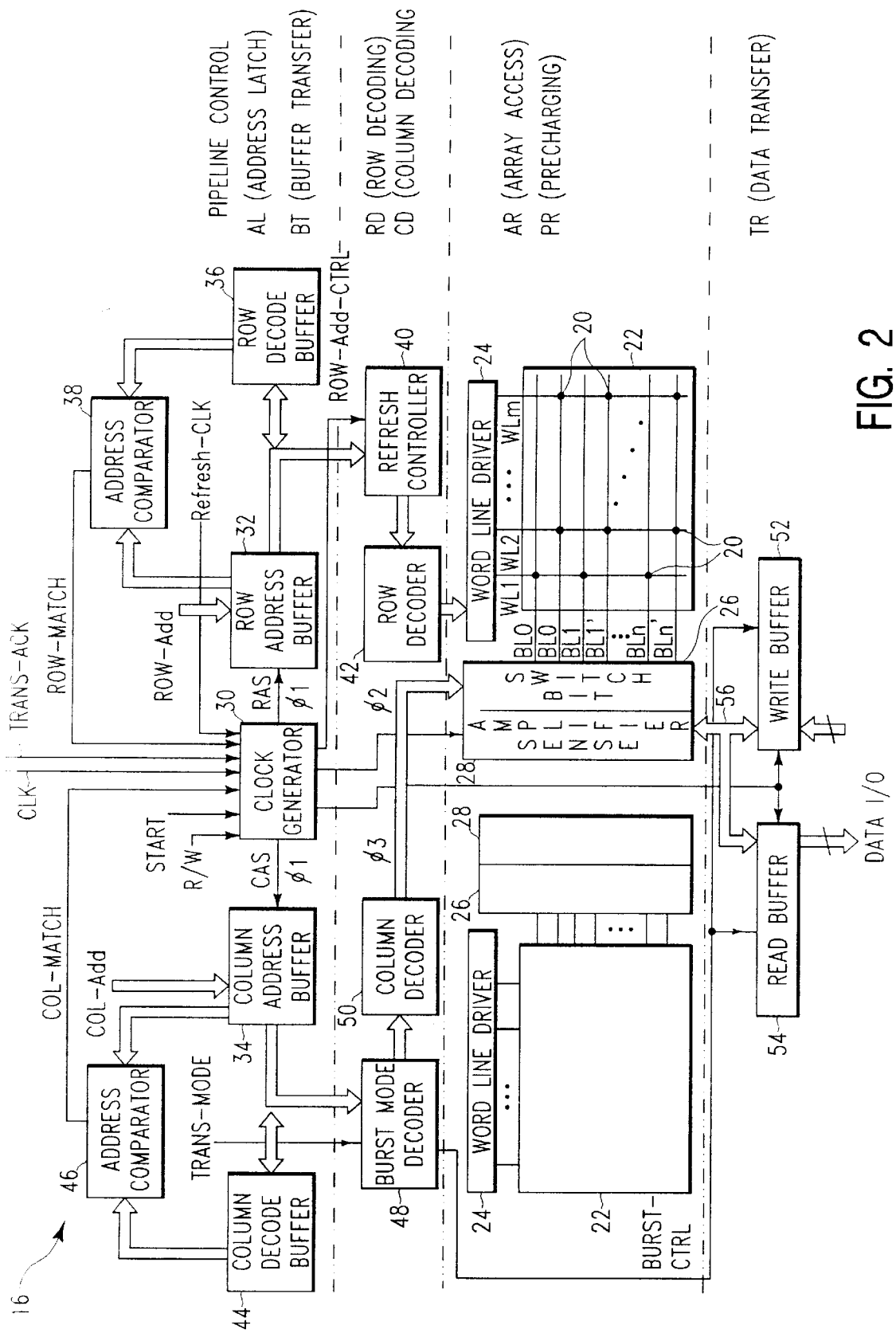
FIG. 2 is a block diagram showing an approximate configuration of a storage device according to a first embodiment.

As shown in FIG. 2, the storage device 16 includes a DRAM array 22 comprising a large number of DRAM cells 20 arranged in a matrix and shown by circles in FIG. 2. The DRAM array 22 has (m) word lines WL1 to WLm and (n) pairs of bit lines BL1, BL1', . . . , BLn, BLn', and the word lines cross the pairs of bit lines. Each of the DRAM cells 20 is connected to one of the pairs of bit lines BL1, BL1', BLn, BLn' via one of the word lines WL1 to Wlm. The word lines WL1 to WLm are each connected to a word line driver 24, and the pairs of bit lines BL1, BL1', . . . , BLn, BLn' are each connected to a bit switch 26 and a sense amplifier 28.

The storage device 16 includes a plurality of blocks comprising the DRAM array 22, the word line driver 24, the bit switch 26, and the sense amplifier 28 (by way of example, two such blocks are shown in FIG. 2). The word line driver 24, the bit switch 26, and the sense amplifier 28 correspond to an array access section according to this invention. Although FIG. 2 shows the sense amplifier 28 as a single block, there are in fact (n) sense amplifiers 28 each connected and corresponding to a different pair of bit lines. A column of DRAM cells 20 connected to a plurality of bit lines via the same word line (a column of DRAM cells 20 with the same row address) are collectively called a "line" below.

The storage device 16 comprises a clock generator 30, a row address buffer 32, and a column address buffer 34. The clock generator 30, the row address buffer 32, and the column address buffer 34 are each connected to the bus 18. A clock signal CLK, a read/write request signal R/W, an access start signal START, a refresh clock signal Refresh-CLK are input to the clock generator 30 from the external source, a row address ROW-Add is input to the row address buffer 32, and a column address COL-Add is input to the column address buffer 34.

The clock signal CLK is constantly input to the clock generator 30. The read/write request signal R/W is input to the clock generator 30 when a data read from or a data write to the storage device 16 is requested from the read/write request source. The access start signal START becomes active when the setting of the mode and the input of addresses are executed to start a read or write.

The row address ROW-Add and the column address COL-Add represent the row and the column addresses of an area of the DRAM array 22 from or to which data is read or written, and input to a row address buffer 32 and a column address buffer 34, respectively, in synchronism with the access start signal START. According to the first embodiment of this invention, the time to refresh the DRAM array 22 is managed by a memory controller 17 outside the storage device 16 or by the inside of the storage device 16, and the refresh clock signal Refresh-CLK represents the time to refresh each line of the DRAM array 22.

The clock generator 30 is connected to the row address buffer 32 and the column address buffer 34. The row address buffer 32 is connected to a row decode buffer 36 and an address comparator 38, and also connected to a row decoder 42 via a refresh controller 40. The row decode buffer 36 corresponds to an address buffer for saving addresses according to this invention. The row decode buffer 36 is connected to the address comparator 38, which is in turn connected to the clock generator 30. The refresh controller 40 is connected to the clock generator 30, and the row decoder 42 is connected to the word line driver 24 of each block.

The DRAM array 22 is refreshed on a line basis, and the refresh controller 40 holds as a refresh address the row address of a line to be refreshed. Since the first embodiment has a plurality of blocks each including the DRAM array 22, the refresh address represents a particular line of the DRAM array 22 of a particular block.

The column address buffer 34 is connected to a column decode buffer 44 and an address comparator 46, and also connected to a column decoder 50 via a burst mode decoder 48. The column decode buffer 44 also corresponds to the address buffer for saving addresses according to this invention. The column decode buffer 44 is connected to the address comparator 46, which is in turn connected to the clock generator 30. The burst mode decoder 48 is connected to the bus 18, and the column decoder 50 is connected to the bit switch 26 of each block.

The sense amplifier 28 and bit switch 26 of each block are each connected to the clock generator 30, and also connected to a write buffer 52 for temporarily holding write data transferred from an external source via the data line 56 and a read buffer 54 for temporarily holding read data. The read buffer 54 and the write buffer 52 correspond to a data buffer according to this invention, and are connected to the data bus (not shown) of the bus 18 and to the clock generator 30 and the burst mode decoder 48.

The refresh controller 40, the row decoder 42, the burst mode decoder 48, and the column decoder 50 correspond to an address decode section according to this invention, and the read buffer 54 and the write buffer 52 correspond to a data transfer section according to this invention.

Figure 3:
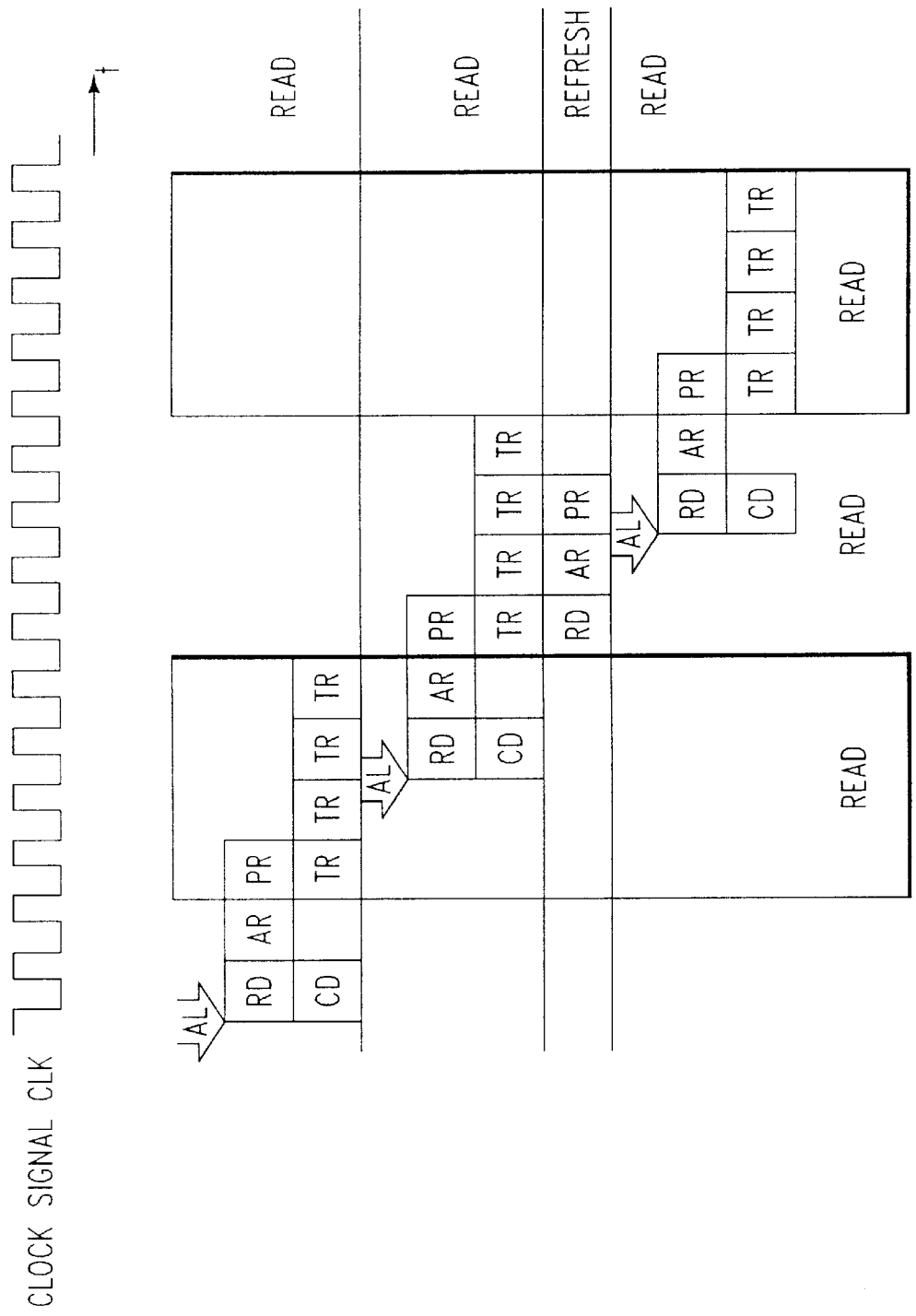
FIG. 3 is a timing chart showing the processing executed when data read requests are continuously input and the time has come to execute refreshing.

The case in which a read from the storage device 16 of burst data comprising four continuous unit data (a four beat burst of the smallest burst length of burst data) is requested is described below to show the effects of the first embodiment of this invention. FIG. 3 is referenced. Of course, if a read or write of burst data of a larger data length than four beat burst (for example, eight or 16 beat burst) is requested, the following read or write processing can be executed with more simple timings.

When signals for ordering a read of the data are input as the access start signal START and the read/write request signal R/W, the clock generator 30 outputs an RAS (Row Address Strobe) signal to the row address buffer 32 and a CAS (Column Address Strobe) signal to the column address buffer 34. This causes the row address buffer 32 and the column address buffer 34 to latch the row address ROW-Add and column address COL-Add (read address) input via the bus 18, respectively (address latch: AL).

When the row address buffer 32 and the column address buffer 34 latch addresses, the clock generator 30 outputs a control signal φ1 instructing the latched addresses to be transferred to the row decoder 42 and the column decoder 50. This causes the row address latched in the row address buffer 32 to be transferred to the row decoder 42 via the refresh controller 40 and the column address latched in the column address buffer 34 to be transferred to the column decoder 50 via the burst mode decoder 48.

The row decoder 42 decodes (to which block an access is applicable, etc.) the input row address (in this case, a read address), that is, determines what block should be accessed, and outputs a signal indicating the decoded row address to the word line driver 24 for the specified block (row decoding: RD).

The burst mode decoder 48 receives a transfer mode signal TRANS-MODE from the read/write request source via the bus 18. The transfer mode signal TRANS-MODE indicates whether or not the read/write request source is requesting a burst transfer mode in which burst data (read or write data) comprising a plurality of unit data (an amount of data that is transferred during each clock between the storage device 16 and the external device) is continuously and sequentially transferred between the storage device 16 and the read/write request source, and also denotes a burst length (the length of burst data) in the burst transfer mode.

The burst mode decoder 48 outputs to the column decoder 50 the column address input from the column address buffer 34 and the length of the data to be read or written (in a normal mode, the length of the unit data). If, however, the burst transfer mode has been requested, the burst mode decoder sets the burst length requested as the data length in order to carry out a single read or write of the burst data from or to the DRAM array 22, and outputs it to the column decoder 50.

The column decoder 50 decodes the column address (in this case, a read address) input from the burst mode decoder 48, and outputs a signal indicating the decoded column address and data length to the bit switch 26 of the specified block (column decoding: CD).

During the subsequent clock signal cycle, the clock generator 30 outputs a control signal φ2 instructing a data read to the sense amplifier 28 of a particular block from which data is to be read. In synchronism with a control signal φ2, the word line driver 24 activates a particular word line of the DRAM array 22 which corresponds to the input row address ROW-Add. The pairs of bit lines BL1, BL1', ..., BLn, BLn' have been precharged, and the potential of one of each pair of bit lines varies according to the data stored in the line (the DRAM cell column) connected to each bit line via a particular word line.

The sense amplifier 28 compares the levels of signals input via the pairs of bit lines BL1, BL1', ..., BLn, BLn', for each pair, and amplifies the level of the signal of each pair of bit lines input from that bit line the input signal level of which has varied so as to increase the difference between this level and the level of the signal input from that bit line the input signal level of which has not varied. The sense amplifier 28 then outputs the amplified signals to the bit switch 26 as read data, and uses it to drive the pairs of bit lines BL1, BL1', ..., BLn, BLn'. This allows the data stored in the line to be written back with an increased signal level.

During a data read, the bit switch 26 outputs only those of the read data input from the sense amplifier 28 which are externally requested to be read, to the read buffer 54 as read data according to the column address and input data length indicated by the signal input from the column decoder 50. The read data output by the bit switch 26 is retained in the read buffer 54. During a data read, data is read from the DRAM array 22 in this manner (array access: AR).

Next, if the data transfer start signal TRANS-ACK is active, the clock generator 30 outputs to the read buffer 54 a control signal φ3 for transferring the read data held in the read buffer 54 to the external destination in synchronism with clock signals via the data bus, and outputs to the sense amplifier 28 of the particular block a control signal φ2 instructing the pairs of bit lines BL1, BL1', ..., BLn, BLn' to be precharged. The burst mode decoder 48 outputs a burst control signal BURST-CTRL to the read buffer 54. This causes the read buffer 54 to sequentially transfer the retained read data to the external destination via the data bus on a unit data basis with the timing in synchronism with clock signals (data transfer: TR).

During the same cycle during which the leading unit data constituting the read data is transferred, the sense amplifier 28 drives the pairs of bit lines BL1, BL1', ..., BLn, BLn' so as to set all the bit lines at a predetermined constant level (for example, the intermediate level between a high level and a low level) according to the control signal φ2. This allows the bit lines of the DRAM array 22 to be precharged (PR) for a subsequent array access (AR).

The processing described above is carried out when a data read is requested, and corresponds to an operation of a read/write controller according to this invention. Each time a data read is requested, the clock generator 30 executes address latch (AL), and then allows row decoding (RD) and column decoding (CD), an array access (AR), data transfer (TR), and precharging (PR) to be sequentially carried out in a pipelined manner with the above timing during the respective clock signal cycles.

When data reads are continuously requested, and if the clock generator 30 detects the arrival of the time to execute refreshing based on the refresh clock signal Refresh-CLK input from the external device, then the clock generator 30 provides control so as to initiate a series of refreshing operations (corresponding to an operation of a refresh controller according to this invention) during a cycle during which data transfer (TR) and precharging (PR) are executed.

That is, the clock generator 30 outputs a refresh address output request ROW-Add-CTRL to the refresh controller 40 with the timing in synchronism with the end of the transfer of the last unit data of the read data comprising four unit data. This causes the refresh controller 40 to output the retained refresh address to the row decoder 42 and also to update it. The row decoder 42 then decodes the input refresh address (the row address) to output it to the word line driver 24 of the specified block (row decoding: RD).

During the subsequent cycle, the clock generator 30 outputs a control signal φ2 instructing the sense amplifier 28 to refresh the DRAM array 22. In synchronism with the control signal φ2, a decoded row address (a refresh address) is input to the word line driver 24, which activates the word line corresponding to the refresh address based on the input row address (the refresh address). Since the pairs of bit lines BL1, BL1', ..., BLn, BLn' were precharged during the preceding cycle, the potential of one of each pair of bit lines varies as described above, and signals are input to the sense amplifier 28 via the pairs of bit lines BL1, BL1', ..., BLn, BLn'.

The sense amplifier 28 amplifies the level of the signals input via the pairs of bit lines BL1, BL1', ..., BLn, BLn', and uses the amplified signals to drive the pairs of bit lines in order to write back the read data, as described above. The read data, however, is not output. Consequently, refreshing is carried out wherein the previously stored data that now has an increased signal level is written back to the line (the DRAM cell column) corresponding to the refresh address (array access: AR).

During the subsequent clock signal cycle, the clock generator 30 outputs to the sense amplifier 28 a control signal φ2 instructing the pairs of bit lines BL1, BL1', ..., BLn, BLn' to be precharged. This causes the bit lines of the DRAM array 22 to be precharged (PR) for a subsequent array access (AR) in the same manner as described above.

As described above and is apparent from the FIG. 3, an array access for a data read is executed during the cycle subsequent to the cycle during which the series of refreshing operations comprising row decoding (RD), an array access (AR), and precharging (PR) are completed. Thus, even if a read of burst data comprising four unit data is continuously requested over four clock cycles and the time has come to execute refreshing, data can be transferred during each clock signal cycle. As a result, the usage efficiency of the bus 18 is 100%, and data can be read from the DRAM array 20 in a constant and short access time whether or not refreshing is being executed.

Next, the case in which a write to the storage device 16 of burst data comprising four continuous unit data is requested is described with reference to FIG. 4.

When signals for ordering a write of the data are input as the access start signal START and the read/write request signal R/W, the clock generator 30 outputs the RAS signal to the row address buffer 32 and the CAS signal to the column address buffer 34. This causes the row address buffer 32 and the column address buffer 34 to latch the row address ROW-Add and column address COL-Add (write address) input via the bus 18, respectively (address latch: AL).

When the write request source further inputs the data transfer start signal TRANS-ACK (in FIG. 4, two clocks after the input of the read/write request signal R/W), the clock generator 30 outputs to the write buffer 52 a control signal φ3 instructing write data transferred from the write request source to be retained, and the burst mode decoder 48 outputs the burst control signal BURST-CTRL. This allows the write buffer 52 to retain write data sequentially transferred from the write request source via the data bus on a unit data basis with the timing in synchronism with clock signals (data transfer: TR). Once the write buffer 52 completes the transfer of the write data, it outputs a data transfer acknowledgement to the write data transfer source.

In parallel with this data transfer, the clock generator 30 outputs a control signal φ1 instructing the row address buffer 32 and the column address buffer 34 to transfer addresses to the row decode buffer 36 and the column decode buffer 44. This allows the row address stored in the row address buffer 32 to be transferred to the row decode buffer 36 and the column address stored in the column address buffer 34 to be transferred to the column decode buffer 44, and both addresses are held in these buffers (buffer transfer: BT).

If a subsequent request (a read or write) is input during data transfer (TR) (the case in which a subsequent request is not input is described below), and when the data transfer (TR) has been completed, the clock generator 30 outputs a control signal φ1 instructing the addresses held in the row decode buffer 36 and the column decode buffer 44 to be transferred to the row decoder 42 and the column decoder 50. This allows the row address latched in the row address buffer 32 to be transferred to the row decoder 42 via the refresh controller 40 and the column address latched in the column address buffer 34 to be transferred to the column decoder 50 via the burst mode decoder 48. Row decoding (RD) is carried out in the row decoder 42, while column decoding (CD) is executed in the column decoder 50.

In the subsequent clock signal cycle, the clock generator 30 outputs to the write buffer 52 a control signal φ3 instructing write data to be transferred from the write buffer 52 to the bit switch 26, and also outputs a control signal φ2 instructing data to be written to the DRAM array 22 to the sense amplifier 28 of a specified block to which the write data is to be written. This causes the write data to be transferred from the write buffer 52 to the bit switch 26.

In synchronism with the output of the control signal φ2, a decoded signal from the row decoder 42 is input to the word line driver 24 of a specified block, and a decoded signal from the column decoder 50 is input to the bit switch 26. The word line driver 24 activates a particular word line corresponding to the input row address. The pairs of bit lines BL1, BL1', . . . , BLn, BLn' have been precharged, and signals are input to the sense amplifier 28 via the pairs of bit lines BL1, BL1', . . . , BLn, BLn'. In addition, during a data write, the bit switch 26 outputs write data to the sense amplifier 28 corresponding to the address to which the write data is to be written, based on the column address and data length input by the column decoder 50.

The sense amplifier 28 amplifies the level of signals input via the pairs of bit lines BL1, BL1', . . . , BLn, BLn', and uses the amplified signals to drive the pairs of bit lines in order to write back the read data. The sense amplifier 28 to which the write data has been input from the bit switch 26, however, drives the pairs of bit lines according to the input write data. Consequently, the write data is written to those DRAM cells 20 connected to each bit line via the activated word line so as to constitute a DRAM cell column which correspond to the write address, while the unchanged data is written back to the other DRAM cells 20. Data is written to the DRAM array 22 in this manner (array access: AR).

During the subsequent clock signal cycle, the clock generator 30 outputs a control signal φ2 instructing precharging to the sense amplifier 28, which then precharges (PR) the bit lines of the DRAM array 22 for a subsequent array access (AR).

The processing described above is carried out when a data write is requested by a data write request source, and corresponds to an operation of the read/write controller according to this invention. Each time a data write is requested, the clock generator 30 executes address latch (AL), and then allows data transfer (TR), buffer transfer (BT), row decoding (RD), column decoding (CD), an array access (AR), and precharging (PR) to be sequentially carried out in a pipelined manner with the above timing during the respective clock signal cycles.

Figure 4:
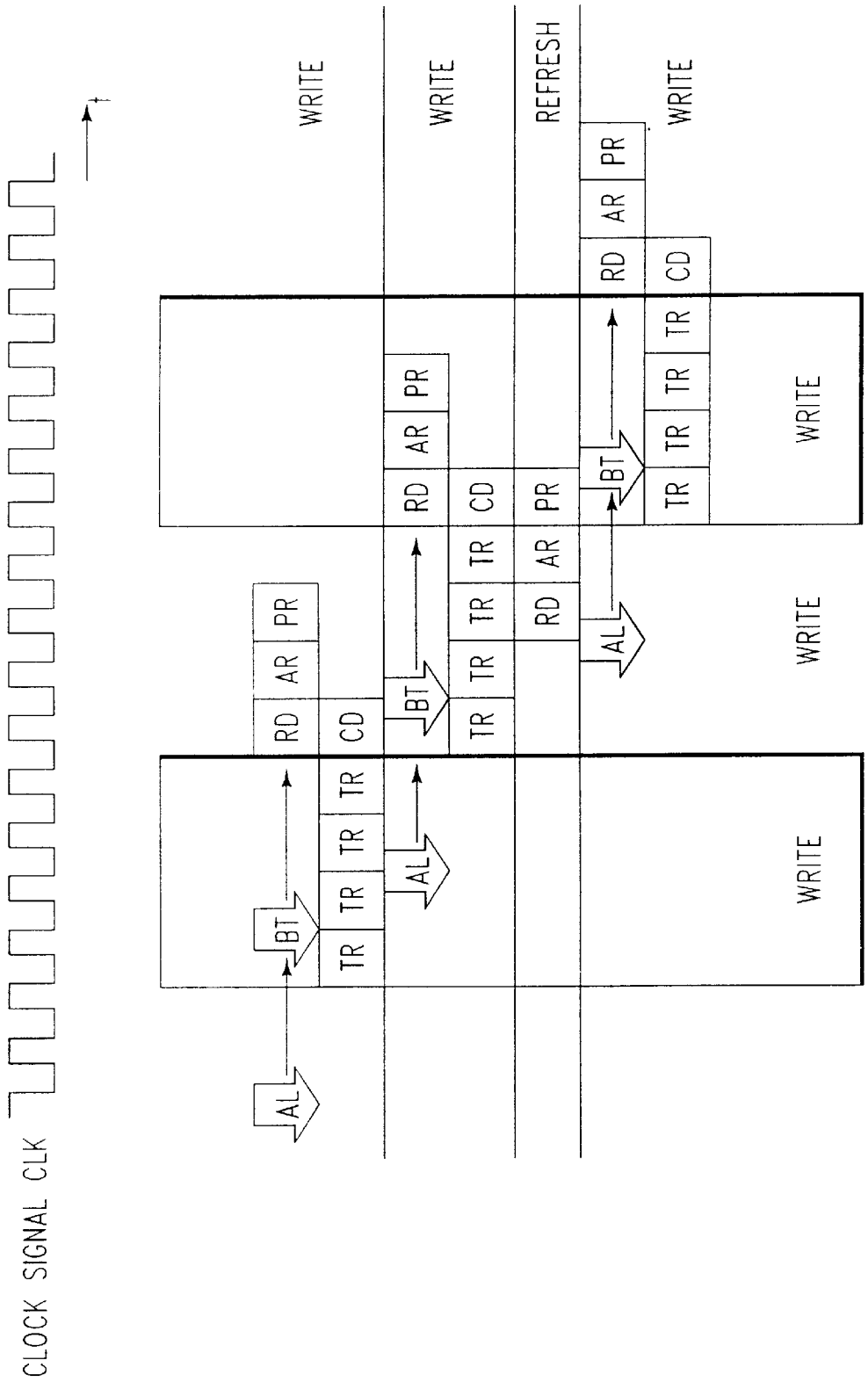
FIG. 4 is a timing chart showing the processing executed when data write requests are continuously input and the time has come to execute refreshing.

When data writes are continuously requested, and if the clock generator 30 detects the arrival of the time to execute refreshing, then the clock generator 30 allows the initiation of a series of refreshing operations comprising row decoding (RD), an array access (AR), and precharging (PR) during a cycle during which the third unit data of the write data comprising four unit data is transferred, as shown in FIG. 4.

As described above and is apparent from the FIG. 4, an array access (AR) for a data read is executed during the cycle subsequent to the cycle during which the series of refreshing operations are completed. Thus, even if a write of burst data comprising four unit data is continuously requested over four clock cycles and the time has come to execute refreshing, data can be transferred during each clock signal cycle. As a result, the usage efficiency of the bus 18 is 100%, and data can be written to the DRAM array 22 in a constant and short access time whether or not refreshing is being executed.

In this processing for a data write request, an array access (AR) is carried out during the cycle two clocks after the transfer of write data has been completed, and precharging (PR) for an array access is executed during the third cycle, whereas in the above processing for a data read request, an array access (AR) is carried out one clock before the transfer of read data is initiated, and precharging (PR) is executed during the subsequent cycle.

Figure 5:
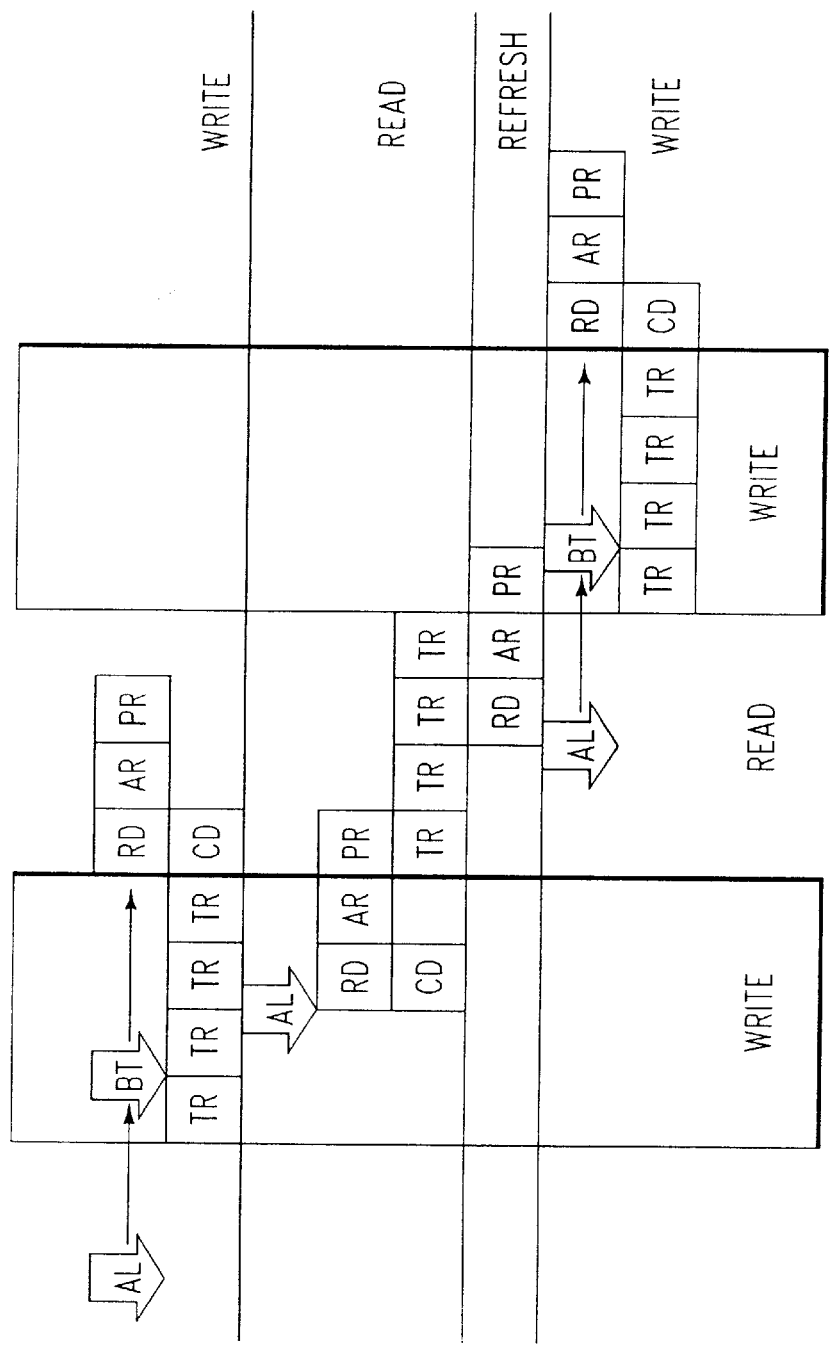
FIG. 5 is a timing chart showing the processing executed when a data write, a data read, and a data write requests are continuously input and the time has come to execute refreshing.

Consequently, if a read request is input (four clocks) after a write request, the timing for the array access (AR) and precharging (PR) for the data write request is prevented from overlapping the timing for the array access (AR) and precharging (PR) for the data read request by executing processing according to each request with the above timings, as shown in FIGS. 5 and 6(A). The transfer of read data can thus be initiated during the cycle subsequent to the end of the transfer of write data. This is true of the case in which the refreshing sequence is carried out due to the arrival of the time to execute refreshing two clocks after the cycle during which the transfer of the read data is initiated, as shown in FIG. 5.

Thus, even if a read request is input (four clocks) after a write request, there will be no cycle during which the data bus must remain in a standby state, and the usage efficiency of the bus will be 100%. In addition, the cycle time is never increased, so data can be written to or read from the DRAM array 22 in a constant and short access time.

In addition, if a read request is input five clocks after a write request has been input, the clock generator 30 initiates the execution of a series of data write operations subsequent to row decoding (RD) and column decoding (CD), during the same cycle during precharging (PR) of the data read processing is carried out (the cycle two clocks after the completion of the transfer of write data), as shown in FIG. 6 (A). This prevents the timing for the array access (AR) and precharging (PR) for the data write request from overlapping the timing for the array access (AR) and precharging (PR) for the data read request, and enables data writes from and data reads to the DRAM array 22 to be each executed in a constant and short access time.

In this data write processing, if a new request (for a read or write) is not input before the transfer of the third unit data of the write data has not been completed, that is, if there is an interval of six or more cycles between the input of a data write request and the input of the subsequent request, the clock generator 30 initiates the execution of a series of data write operations subsequent to row decoding (RD) and column decoding (CD), during the same cycle during which the fourth unit data of the write data is transferred, as shown in FIGS. 6(C) and (D).

Thus, even if the subsequently input request specifies a data read, the array access (AR) and precharging (PR) for the data read request are carried out after the array access (AR) and precharging (PR) for the data write request, as shown in FIG. 6(D), if there is an interval of seven or more clocks between the input of the data read request and the input of the data write request. This prevents the timing for the array access (AR) and precharging (PR) for the data write request from overlapping the timing for the array access (AR) and precharging (PR) for the data read request, and enables data writes and data reads to be each executed in a constant and short access time.

In addition, if a data read request is input six clocks after a data write request has been input, the transfer of read data cannot be initiated two clocks after the data read request has been input if the array access (AR) and precharging (PR) for the data write request are executed first. Thus, if the data read request is input six clocks after the data write request, that is, if the data read request is input at the same time when the transfer of the fourth unit data constituting the write data is completed, the clock generator 30 cancels the row decoding (RD) and column decoding (CD) for the data write request (corresponding to dotted "RD" and "CD" in the figure) which are being executed simultaneously with the transfer of the fourth unit data, as shown in FIG. 6(C), temporarily saves the write address to the row decode buffer 36 and the column decode buffer 44, and executes the processing for the data read request.

A series of data write operations subsequent to row decoding (RD) and column decoding (CD) is then carried out during the same cycle (three clocks after the transfer of the write data has been completed) during which the precharging (PR) of the data read processing is executed, based on the write address held in the row decode buffer 36 and the column decode buffer 44. This prevents the timing for the array access (AR) and precharging (PR) for the data write request from overlapping the timing for the array access (AR) and precharging (PR) for the data read request, and enables data writes and data reads to be each executed in a constant and short access time.

If a read request is input four to six clocks after a write request has been input, the array access (AR) for the previously input write request is carried out after the array access (AR) for the subsequently input read request has been executed, as shown in FIGS. 6(A) to (C). As a result, if the addresses in both requests are the same, the old data is read without being subjected to a write of data to be written according to the previously input write request, resulting in the inconsistency of the data.

The storage device 16, however, has address comparators 38 and 46. The address comparator 38 compares the row address held in the row address buffer 32 (the write address specified by the previously input write request) to the row address retained in the row decode buffer 36 (the read address specified by the subsequently input read request), and if they match, outputs a match signal ROW-MATCH to the clock generator 30. The address comparator 46 also compares the column address held in the column address buffer 34 (the write address specified by the previously input write request) to the column address retained in the column decode buffer 44 (the read address specified by the subsequently input read request), and if they match, outputs a match signal COL-MATCH to the clock generator 30.

If a read request is input four to six clocks after a write request has been input, and if match signals ROW-MATCH and COL-MATCH are input from the address comparators 38 and 46, respectively, the clock generator 30 aborts the array access (AR) and precharging (PR) for the data read request and outputs to the write buffer 52 and the read buffer 54 a control signal φ3 instructing data transfer from the write buffer 52 to the read buffer 54.

This causes the transfer to the read buffer 54 of the write data transferred from the data write request source and held in the write buffer 52, and the subsequent transfer of the transferred write data from the read buffer 54 as read data.

Thus, even if four to six clocks after a write request has been input, a data read from the same address as the write request is requested, data consistent as read data can be transferred to the data read request source.

On the other hand, if a read request is input (four clocks) after a write request and the time has come to execute refreshing simultaneously with the initiation of the transfer of read data, and if a series of operations subsequent to row decoding (RD) and column decoding (CD) for the data write request is initiated with the timing shown in FIG. 5, the timing for the array access (AR) and precharging (PR) for the data write request will overlap the timing for the array access (AR) and precharging (PR) for refreshing. Consequently, the initiation of the series of operations subsequent to row decoding (RD) and column decoding (CD) for the data write request must be delayed.

As described above, if a write request is followed by a read request, a series of operations subsequent to row decoding (RD) and column decoding (CD) for the data write request must be executed after the execution of a series of operations subsequent to row decoding (RD) and column decoding (CD) for the data read request.

Figure 7:
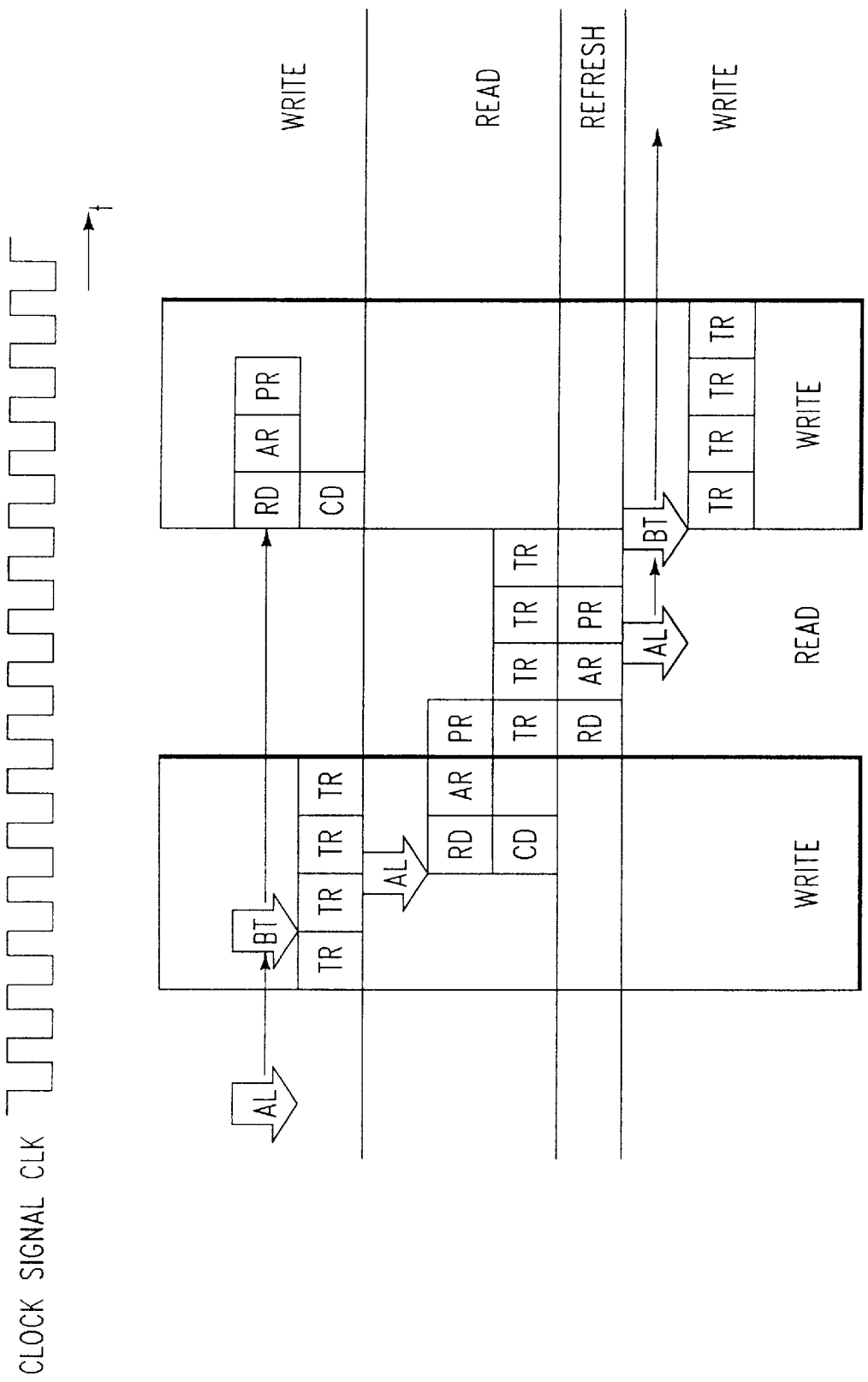
FIG. 7 is a timing chart showing the processing executed when a data write, a data read, and a data write requests are continuously input and the time to execute refreshing has come two clocks earlier than in the case shown in FIG. 5.

If the input of a read request following a write request has forced the delay of the initiation of a series of operations subsequent to row decoding (RD) and column decoding (CD) for the data write request, logically simple control can be preferably provided by executing the series of operations if the subsequent request specifies a write, as shown in FIG. 7.

In FIG. 7, once the buffer transfer (BT) for the second write request has been completed, a series of operations for the first write request is executed. When this buffer transfer (BT) is carried out, the write address for the first write request has been saved in the row decode buffer 36 and the column decode buffer 44, with the write address for the second write request retained in the row address buffer 32 and the column address buffer 34 by address latching (AL).

The buffer transfer (BT) thus swaps the write address retained in the row address buffer 32 and the column address buffer 34 for the write address saved in the row decode buffer 36 and the column decode buffer 44. Consequently, once the buffer transfer (BT) has been completed, the write address for the first write request is transferred from the row address buffer 32 and the column address buffer 34 to the row decoder 42 and the column decoder 50, and a series of operations subsequent to row decoding (RD) and column decoding (CD) for the first write request is then carried out.

If no data read or write has been requested, and when the clock generator 30 determines that the time has come to carry out refreshing, it immediately allows a series of refreshing operations to be executed. The case in which a read request is input at the same time when or immediately after the execution of refreshing is initiated is described below.

Figure 8A:
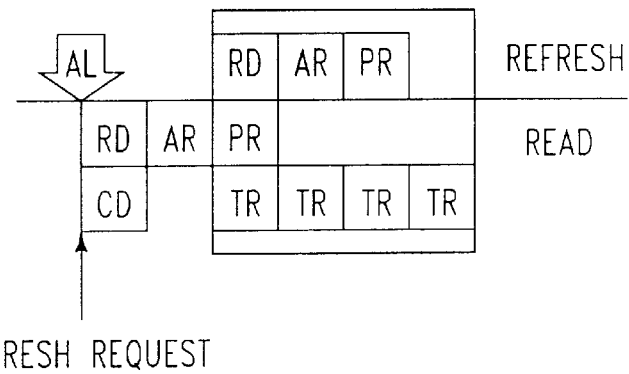
FIG. 8(A) is a timing chart showing the processing executed when a data read request is input at the same time when a refresh request is input.

If a data read request is input at the same time when the execution of refreshing is initiated, the clock generator 30 gives top priority to the execution of the data read processing, and initiates the execution of a series of refreshing operations comprising row decoding (RD), an array access (AR), and precharging (PR) during the same cycle during which the precharging (PR) of the data read processing is executed, as shown in FIG. 8(A).

Figure 8B:
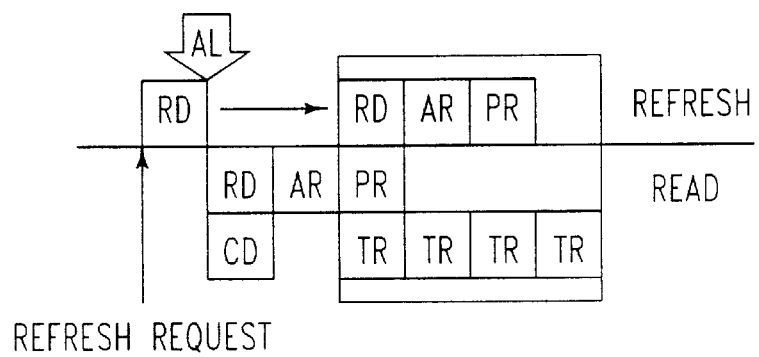
FIG. 8(B) is a timing chart showing the processing executed when a data read request is input one clock after a refresh request is input, and FIG. 8© is a timing chart showing the processing executed when a data read request is input two clocks after a refresh request is input.

In addition, if a data read request is input one clock after the execution of refreshing has been initiated, the clock generator 30 cancels the row decoding (RD) of the series of refreshing operations which is being carried out (that is, stops the operation before the word line corresponding to the refresh address becomes active; this corresponds to the dotted "RD" in FIG. 8(B)) in order to execute the data read processing instead, as shown in FIG. 8(B). In this case, the clock generator 30 informs the refresh controller 40 that the execution of refreshing will be cancelled, and the refresh controller 40 returns the updated refresh address to its previous state. The clock generator 30 then initiates the execution of a series of refreshing operations comprising row decoding (RD), an array access (AR), and precharging (PR) during the same cycle during which the precharging (PR) of the data read processing is executed.

Figure 8C:
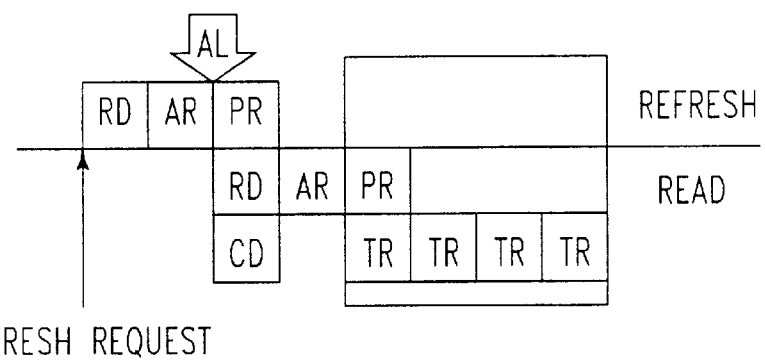

In addition, if a data read request is input one clock after the execution of refreshing has been initiated, the continuation of the series of refreshing operations does not cause the timing for the array access (AR) and precharging (PR) of the series of refreshing operations to overlap the timing for the array access (AR) and precharging (PR) of the data read processing. The clock generator 30 thus continues executing the series of refreshing operations while carrying out the data read processing according to the data read request, as shown in FIG. 8(C).

Thus, if a read request is input at the same time when or immediately after the execution of refreshing is initiated, the request is processed in a constant and short access time. In addition, if a write request is input, operations subsequent to row decoding (RD) and column decoding (CD) are carried out after the completion of the transfer of write data, as described above. As a result, if the write request is input at the same time when or immediately after the execution of refreshing is initiated, the series of refreshing operations can be performed first without creating a problem.

Although the above embodiment has been described in conjunction with the external inputting of row and column addresses, this invention is not limited to this aspect, and a row and a column addresses may be internally generated on the basis of an externally input address, as in SRAMs.

In addition, although in the above embodiment, the refresh address has been internally updated, it may be externally communicated. In this case, the timing for the initiation of the execution of refreshing can be controlled without creating a problem by retaining an externally communicated refresh address in the refresh controller 40.

A second embodiment of this invention is now described. The same components as in the first embodiment have the same reference numerals, and their description is omitted.

Figure 9:
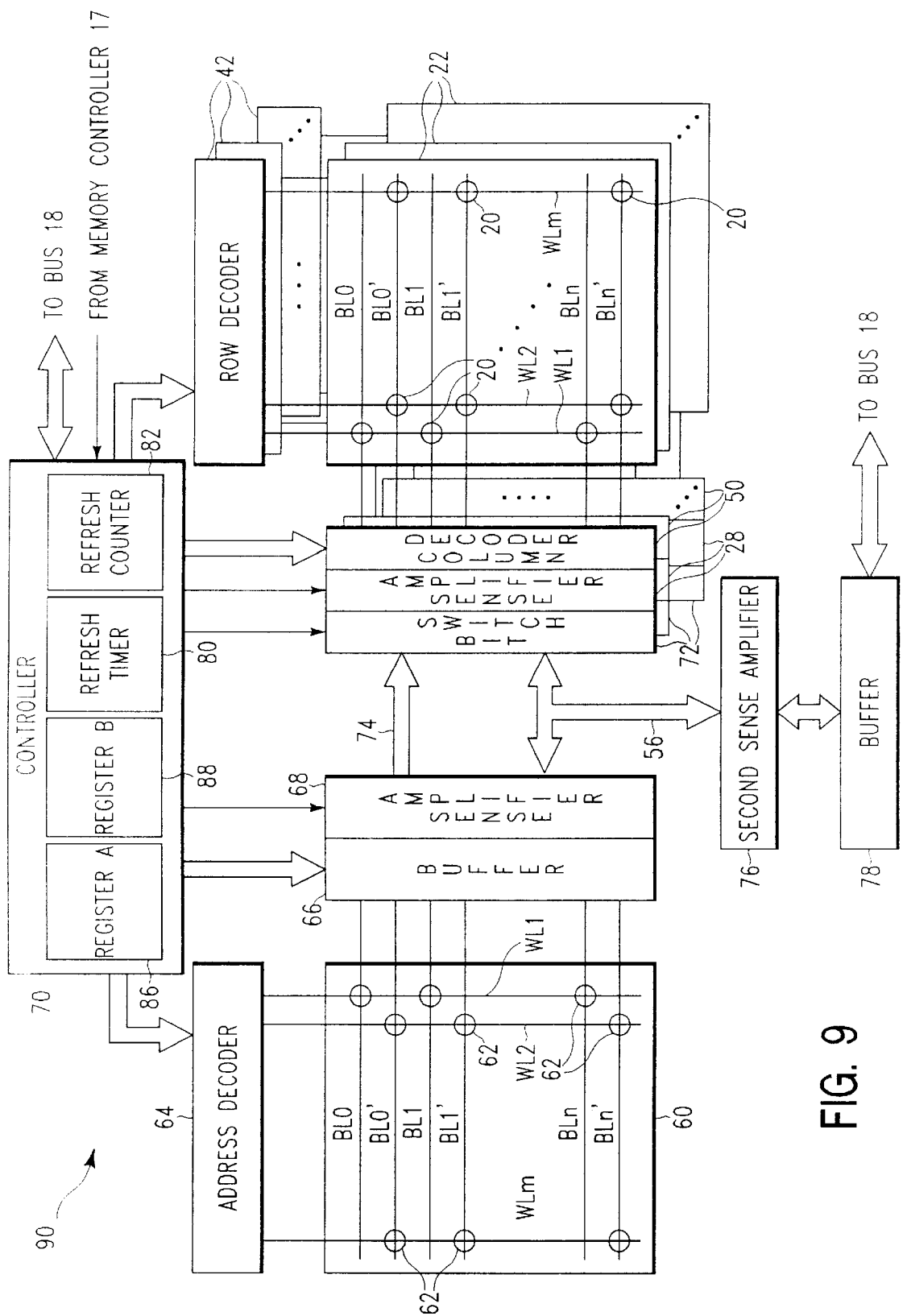
FIG. 9 is a block diagram showing an approximate configuration of a storage device according to a second embodiment.

According to the second embodiment of this invention, a storage device 90 shown in FIG. 9 is used instead of the storage device 16 described in the first embodiment. The storage device 90 according to the second embodiment comprises not only a plurality of (for example, 16) DRAM arrays 22 but also an SRAM array 60 (corresponding to the storage means according to this invention and referred to as a cache array 60 below) of the same storage capacity as a single DRAM array 22. The cache array 60 comprises a large number of SRAM cells 62 arranged in a matrix and shown by the circles in FIG. 9 and includes (m) word lines WL1 to WLm the number of which is the same as that of DRAM arrays 22 and (n) pairs of bit lines BL1, BL1' to BLn, BLn' the number of which is the same as that of DRAM arrays 22. The word lines cross the pairs of bit lines.

Since the SRAM cell 62 is connected to one of the bit lines BL1, BL1' to BLn, BLn' via one of the word lines WL1 to WLm, the number of SRAM cells in the cache array 60 which constitute an SRAM cell column connected to a plurality of bit lines via a single word line is the same as the number of DRAM cells 20 in a single DRAM array 22 which constitute a DRAM cell column connected to a plurality of bit lines via a single word line, and the number of the SRAM cell columns is the same as the number of the DRAM cell columns of a single DRAM array 22. A column (a column of the DRAM cells 20 of the same row address) of DRAM cells 20 in the DRAM array 22 which are connected to (n) bit lines via the same word line and a column of SRAM cells 62 in the cache array 60 which are connected to (n) bit lines via the same word line are each collectively referred to as a "line".

The word lines WL1 to WLm of the cache array 60 are each connected to an address decoder 64, while pairs of the bit lines BL1, BL1' to BLn, BLn' of the cache array 60 are each connected to a buffer 66 and a sense amplifier 68. The address decoder 64, the buffer 66, and the sense amplifier 68 are each connected to a controller 70. Each DRAM array 22 has a row decoder 42 (having both the functions of the row decoder 42 and the word line driver 24 described in the first embodiment), a column decoder 50, a sense amplifier 28, and a bit switch 72. The row decoder 42, column decoder 50, sense amplifier 28, and bit switch 72 of each DRAM array 22 are each connected to the controller 70.

Figure 10A:
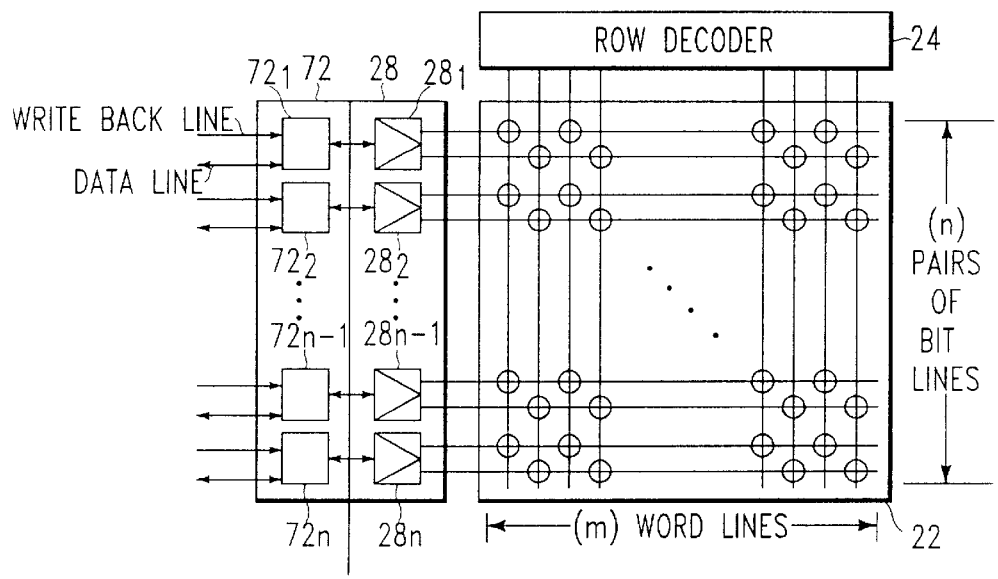
FIG. 10(A) is a schematic block diagram showing one example of the configuration of bit switches wherein as many switches as the (n) pairs of bit lines are provided.

The sense amplifier 28 of each DRAM array 22 comprises (n) sense amplifiers $28_1$ to $28_n$ corresponding to the (n) pairs of bit lines of the DRAM array 22 and sense amplifiers $28_1$ to $28_n$ are each connected to a different pair of bit lines, as shown in more detail in FIG. 10(A). The bit switch 72 for each DRAM array 22 comprises (n) switches $72_1$ to $72_n$ each connected to the sense amplifier $28_1$ to $28_n$. FIG. 10(A) does not show the column decoder 50.

As shown in FIG. 9, a write back line 74 and a data line 56 are each connected to the bit switch 72 (although not shown, the write back line 74 and the data line 56 are each connected to the bit switch 72 for each DRAM array 22), the switches $72_1$ to $72_n$ of the bit switch 72 connect the sense amplifier $28_1$ to $28_n$ to the data line 56 or the write back line 74 according to the instruction by the controller 70. The write back line 74 is connected to the sense amplifier 68 for the cache array 60. In addition, the data line 56 is connected to the sense amplifier 68 for the cache array 60 and to a second sense amplifier 76. The second sense amplifier 76 is connected to a buffer 78 which is in turn connected to a data bus of a bus 18.

The controller 70 is connected to an address and a control buses of the bus 18. The controller 70 incorporates a refresh timer 80 and a refresh counter 82. The controller 70 uses the refresh timer 80 to detect when to carry out refreshing for each DRAM array 22. The refresh counter 82 retains the address (the refresh address) of a specified line of a specified DRAM array 22 which is to be subjected to refreshing.

The controller 70 comprises a register A 86 of a sufficient storage capacity to store (m) bit data ((m) is the number of word lines of a single DRAM array 22 (and a cache array 60)) and a register B 88 of the same storage capacity as the register A 86. Each bit of the registers A 86 and B 88 corresponds to a different line of the cache array 60. The register A 86 stores data corresponding to first identification information, while the register B 88 stores data corresponding to second identification information.

Next, the effects of the second embodiment of this invention is described with reference to the flowcharts in FIGS. 11 to 15 describing the processing executed by the controller 70. Although the flowcharts are used in the following description for the simplicity of description, the processing described below is not limited to software implementations, but may be implemented by hardware including a logical circuit constituting the controller 70. The operations shown in the flowcharts in FIGS. 11 to 15 are performed in parallel within the controller 70, and "one cycle" refers to the period of time during which the operations in each flowchart are sequentially performed from the top of the flowchart until the process again returns to the top.

Figure 11:
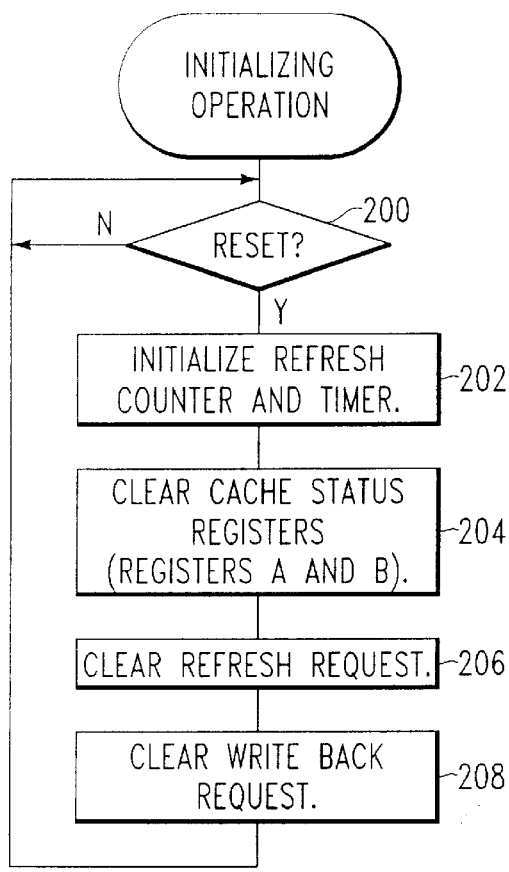
FIG. 11 is a flowchart showing an initializing operation performed by a controller.

An initial setting operation is described with reference to the flowchart in FIG. 11. At step 200, the process determines whether or not resetting must be executed by power-up. If the result of the determination is negative, no operation is performed, whereas if the result is positive, the refresh counter 82 is set at its initial value and the timer value of the refresh timer 80 is reset at step 202, and the register A 84 and the register B 86 are cleared at step 204 (for example, the values of all the bits are set to "0"). At the subsequent step 206, a refresh request (described below) is cleared, and at step 208, a write back request (described below) is cleared to finish the processing.

Figure 12:
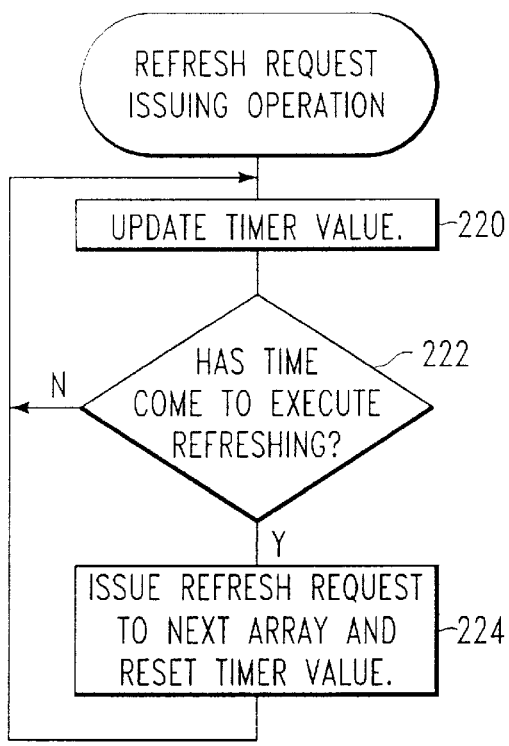
FIG. 12 is a flowchart showing a refresh request issuing operation performed by a controller.

Next, a refresh request issuing operation is described with reference to the flowchart in FIG. 12. At step 220, the timer value of the refresh timer 80 is updated. At the subsequent step 222, the process determines based on the updated timer value whether or not the time has come to refresh a particular DRAM array 22. If the result of the determination is negative, the processing is finished, whereas if the result is positive, a refresh request is issued to the DRAM array to be subsequently refreshed, and the processing is then finished.

Next, a normal read/write operation is described with reference to the flowchart in FIG. 13. At step 240, the process determines whether or not a data read or write has been externally requested via the bus 18. If the result of the determination is negative, the processing is finished, whereas if a data read or write has been requested, the process proceeds to step 242 to determine whether or not the data read or write request specifies the DRAM array 22 to which a refresh request has been issued (the array to be refreshed).

If the result of the determination is positive, the processing is finished (in this case, the requested data read or write is carried out during a refreshing operation described below), whereas if the result is negative, the process proceeds to step 246 to determine whether or not the data read or write request specifies a line with dirty data. The dirty data is described below. If the result of the determination is positive, the processing is finished, whereas if the result is negative, the process proceeds to step 248 to execute a normal data read or write according to the external data read or write request.

That is, if a data read has been requested, the externally input read address is output to the row decoder 42 and column decoder 50 connected to the DRAM array 22 specified by the data read request. A signal instructing a data read is then output to the sense amplifier 28 and the bit switch 72, and a signal instructing a relevant pair of bit lines to be precharged is output to the sense amplifier 28. This causes the execution of a series of data read operations comprising row decoding (RD), column decoding (CD), an array access (AR), buffer transfer (BT), and precharging (PR), as explained in the first embodiment. The data read from the DRAM array 22 is output via a data line 56 to the second sense amplifier 76, where it is amplified and transferred to the data read request source via the buffer 78 and the bus 18.

If a data write has been requested, the write data externally transferred via the bus 18 is held in the buffer 78 (buffer transfer: BT), and then output to the bit switch 72 via the second sense amplifier 76. The externally input read address is output to the row decoder 42 and the column decoder 50 to select the DRAM array 22 specified by the data write request. A signal instructing a data write is then output to the sense amplifier 28 and the bit switch 72, and a signal instructing a relevant pair of bit lines to be precharged is output to the sense amplifier 28. This causes the execution of a series of data write operations comprising buffer transfer (BT), row decoding (RD), column decoding (CD), an array access (AR), and precharging (PR), and the externally transferred write data is written to the DRAM array 22.

Figure 14:
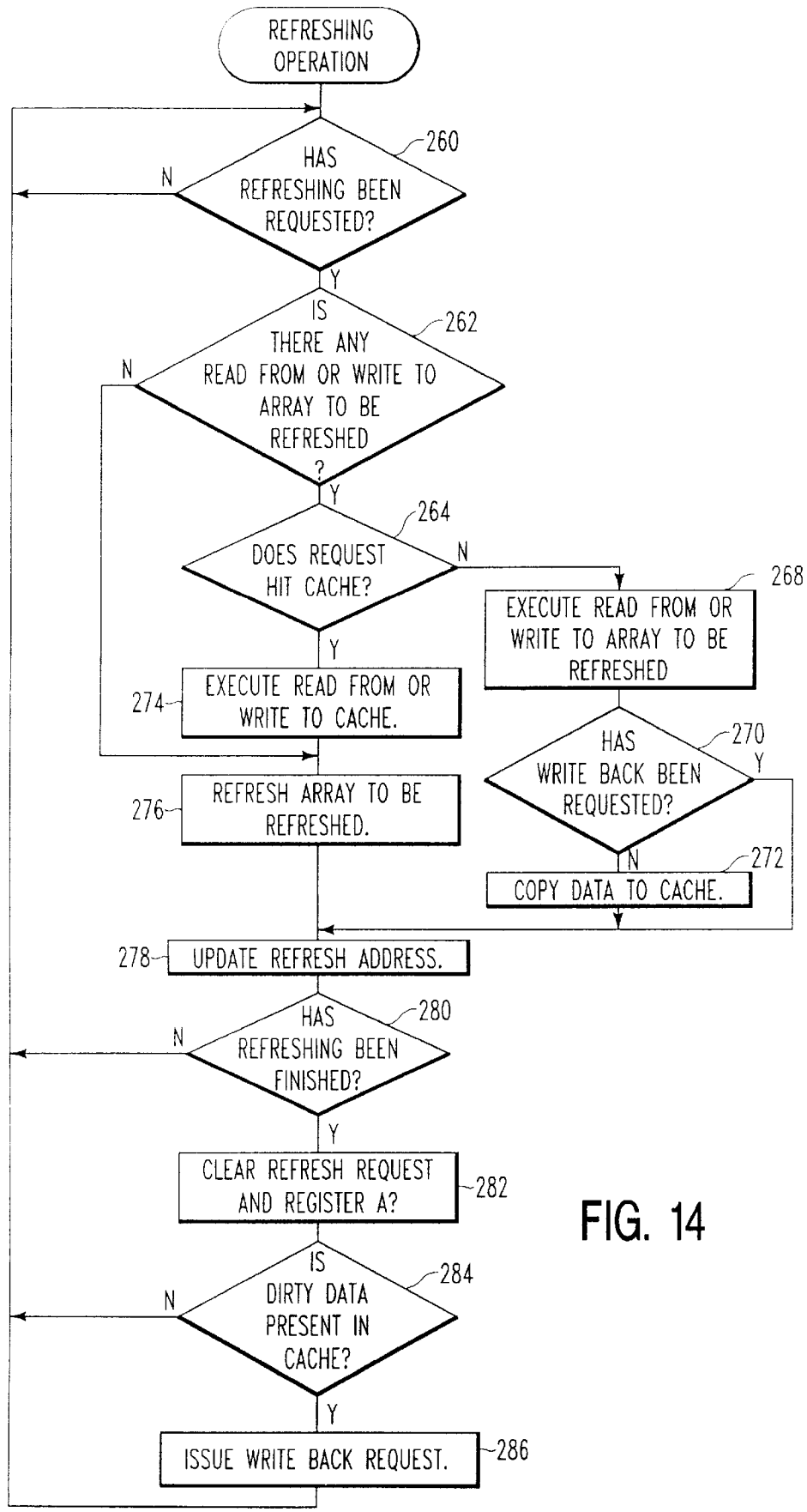
FIG. 14 is a flowchart showing a refreshing operation performed by a controller.

Next, a refreshing operation is described with reference to the flowchart in FIG. 14. At step 260, the process determines whether or not a refresh request has been issued. If the result of the determination is negative, the processing is finished, whereas if the result is positive, the process passes to step 262 to determine whether or not there is an external request for a read or write of data from or to the DRAM array 22 to which a refresh request has been issued (the array to be refreshed). If there is not an external request for a data read or write or the data read or write request specifies a DRAM array 22 other than the DRAM array 22 to be refreshed, the result of the determination is negative, and the process passes to step 276.

At step 276, the refresh address held in the refresh counter 82 is output to the row decoder 42 to select the array to be refreshed, and signals instructing refreshing and precharging, respectively, are sequentially output to the sense amplifier 28 for the array to be refreshed. This causes the execution of a series of refreshing operations comprising row decoding (RD), an array access (AR), and precharging (PR), and the array to be refreshed is refreshed. This refreshing does not use the data line 56, so it can be executed without creating a problem even if data is being read from or written to a DRAM array 22 other than the DRAM array 22 to be refreshed, as described above. This processing corresponds to an operation of a refresh controller according to this invention.

On the other hand, if the result of the determination in step 262 is negative (that is, the data read or write request specifies the array to be refreshed), the process proceeds to step 264 to determine whether or not the data read or write request hits the cache array 60, that is, the data specified by the data read or write request is stored in the cache array 60. Specifically, this determination is made with reference to the information stored in the register A 86. Since the data specified by a first data read or write request issued to the array to be refreshed is not stored in the cache array 60, the result of the determination is negative, and the process proceeds to step 268.

At step 268, data is read from or written to the array to be refreshed according to the data read or write request. If the process determines at step 270 that a write back request (described below) has not been issued, the data in the line from or to which data has been read or written (the data stored in the line including the DRAM cell 22 from or to which data is to be read or written) is copied to the corresponding address of the cache array 60 (if this line (the DRAM cell column) is connected to each bit line via a word line WLx in the DRAM array 22, the data is copied to a line (an SRAM cell column) connected to each bit line via a word line WLx in the cache array 60) at step 272. That bit of the register A 84 which corresponds to that line of the cache array 60 to which the data has been copied is then set (for example, its value is set to "1" (valid)), and the process proceeds to step 278. This processing corresponds to an operation of the read/write controller according to this invention.

Thus, if a data read has been requested, a line of data is read from the array to be refreshed, the read line of data is then written to the cache array 60, and only the requested data of the read line of data is then output to the second sense amplifier 76, as shown in "Read Miss" in FIG. 16(A). If a data write has been requested, a line of data is read from the array to be refreshed, and the read line of data is then written to the cache array 60, and the externally transferred write data is then used to rewrite part of the line of data read from the array to be refreshed, as shown in "Write Thou" in FIG. 16(C). The rewritten data is written back to the array to be refreshed, and the write data is written to the cache array 60.

As described in the first embodiment, during a data read and a data write, the data in the line connected to each bit line via the word line activated by the row decoder 42 is input to the sense amplifier 28 for amplification. Data can be copied to the cache array 60 by outputting data amplified by the sense amplifier 28 to the cache array 60 via the data line 56.

Figure 17:
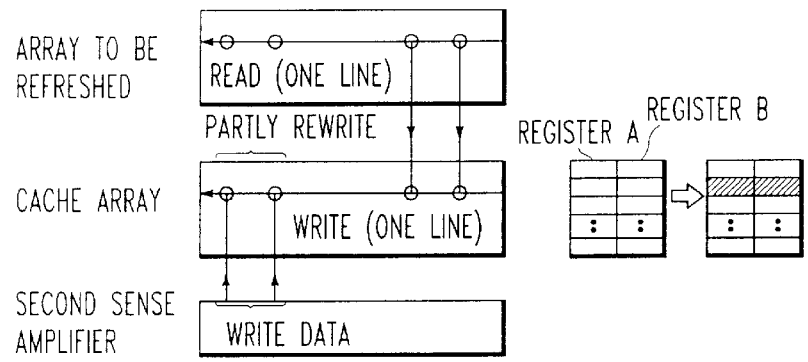
FIG. 17 is a schematic drawing describing another example of the processing executed when a data write to the array to be refreshed is requested.

If the data write request has not hit the cache array 60, the externally transferred write data may be written only to the cache array 60, as shown in "Write Miss" in FIG. 17. In this case, since the array to be refreshed is subjected to only a data read, the latest data of the line from which the data has been read is stored only in the cache array 60, but this condition is avoided by a write back operation described below. The above "Write Thou", however, is preferable because the amount of data to be written back during the write back operation (dirty data) is reduced.

When data in the array to be refreshed is copied to the cache array 60 as described above, the second and subsequent data read or write requests issued to the array to be refreshed can hit the cache array 60 (data to be read or written to is stored in the cache array 60). Whether or not the cache has been hit is determined on the basis of whether or not that bit of the register A 84 which corresponds to the line containing the data to be read or written to has been set (for example, its value has been set to "1"). If the cache is hit, the result of the determination in step 264 is positive, and at step 274, only the cache array 60 is subjected to a data read or write. At the subsequent step 276, the array to be refreshed is refreshed, and the process passes to step 278.

Thus, if a data read has been requested, the data to be read which is stored in the cache array 60 is read and output via the data line 54 and the second sense amplifier 76, and the array to be refreshed is simultaneously refreshed, as shown in "Read Hit" in FIG. 16(B). If a data write has been requested, the externally transferred write data is written via the second sense amplifier 76 and the data line 54 only to the data to be written to which is stored in the cache array 60, and the array to be refreshed is simultaneously refreshed, as shown in "Write Hit" in FIG. 16(D).

In the above "Write Hit", the latest data is stored only in the cache array 60, resulting in the generation of dirty data. The controller 70 thus sets that bit of the register B 86 which corresponds to that line of the cache array 60 to which data has been written (for example, sets its value to "1").

Of course, the access time for an external read or write request in any of "Read Miss", "Write Thou", and "Write Miss", as well as "Read Hit", and "Write Hit" described above is constant and short regardless of the size of read or write data.

At the subsequent step 278, the refresh address held in the refresh counter 82 is updated. That is, if the specified line of the array to be refreshed is refreshed at step 276, the process determines whether or not that bit of the register A 84 which corresponds to the next line has been reset (for example, its value has been set to "0"), and if so, treats the address of the next line as a refresh address. If this bit has been set (for example, its value has been set to "1"), the process retrieves those bits of the register A 84 which have been reset in the ascending order of the address of the line, and sets the address of the line that corresponds to the reset bit as a refresh address.

As a result, among the lines the corresponding bit of which is set in the register A 84 (for example, its value is set to "1"), that is, the lines of the array to be refreshed, those lines from or to which data has been read or written prior to refreshing and the data in which has been copied to the cache array 60 are not refreshed. This is because during a data read or write, the sense amplifier 28 writes back required data on a line basis to eliminate the need of refreshing.

On the other hand, if refreshing has not been executed at step 276, the process determines at step 278 whether or not that bit of the register A 84 for the line which corresponds to the refresh address held in the refresh counter 82 has been reset (for example, its value has been set to "0"). If so, the refresh address is not updated, whereas if the bit has been set, that means that a data read from or a data write to the line to be refreshed has been carried out, so the refreshing of this line is omitted and the address of the line for which the corresponding bit of the register A 84 has been reset is set as a refresh address. The above processing also corresponds to an operation of the refresh controller according to this invention.

At step 280, the process determines whether or not the refreshing of the array to be refreshed has been completed. If the result of the determination is negative, the processing is finished without clearing the refresh request. This causes the above operation to be performed during the subsequent cycle and to then be repeated until all the lines of the array to be refreshed have been subjected to at least one of a data read, a data write or refreshing.

In the above operation, if data reads from or data writes to a specified line of the array to be refreshed are requested, then for the first request, the data in this line is written to the cache array 60, whereas for the second and subsequent requests, the array to be refreshed is refreshed while a read from or a write to the data stored in the cache array 60 is being executed. Thus, even if the reads from or writes to the data in the same line of the array to be refreshed are continuously requested, the array to be refreshed can be refreshed. If a read from or a write to the data in a specified unrefreshed line of the array to be refreshed is carried out, the refreshing of this specified line can be omitted.

The first access to the array to be refreshed after the issuance of a refresh request serves to refresh a specified line whether it is for the refreshing of the specified line, or a data read therefrom, or a data write thereto. Thus, in the above refreshing operation, the amount of dirty data occurring in the cache array 60 is equal to m–1 lines at maximum. Consequently, it is sufficient for the cache array 60 according to the second embodiment of this invention to have a storage capacity equal to that of a single DRAM array 22, and the cache array 60 does not require SRAM array of a large storage capacity as in conventionally known DRAMs with a built-in cache memory comprising SRAMs (RAMTRON EDRAM and other cache DRAMs).

Once the refreshing of the array to be refreshed has been completed, the result of the determination in step 280 is positive, and at step 282, the refresh request issued to the array to be refreshed is cleared, and the register A 84 is also cleared. At the subsequent step 284, the process determines whether or not dirty data is present in the cache array 60. This determination is made by checking whether or not there is a set bit in the register B 86 (for example, the value of any bit is set to "1" in the register B 86). If the result of the determination is negative, the processing is finished, whereas if the result is negative, a write back request is issued to the DRAM array 22 for which refreshing has been completed (referred to as an "array to which data is to be written back") in order to write back the dirty data present in the cache array 60 to the DRAM array 22 for which refreshing has been completed, and the processing is finished.

Figure 15:
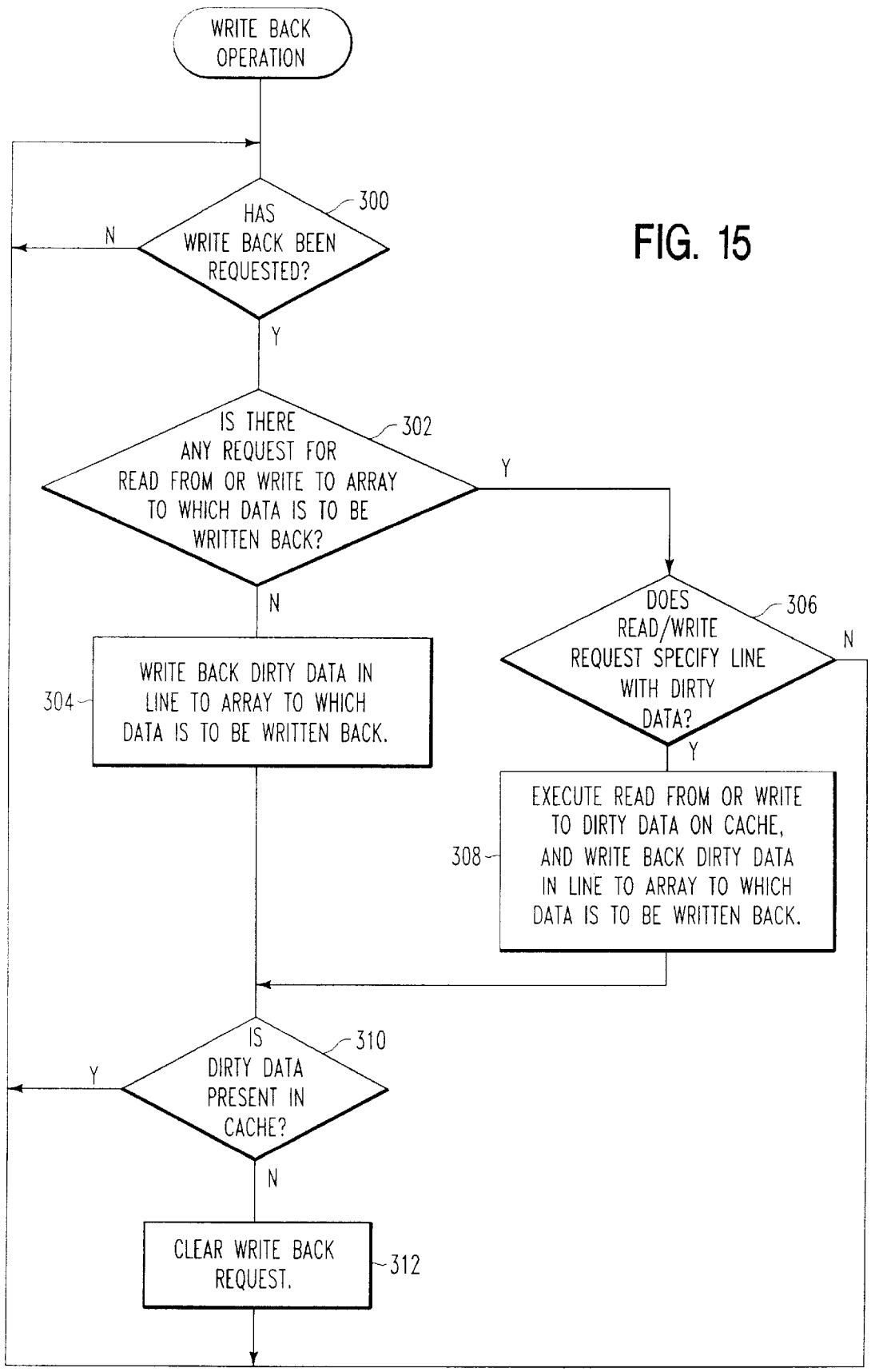
FIG. 15 is a flowchart showing a write back operation performed by a controller.

A write back operation is described with reference to the flowchart in FIG. 15. At step 300, the process determines whether or not a write back has been requested. If the result of the determination is negative, the processing is finished, whereas if the result is positive, the process proceeds to step 302 to determine whether or not a data read or a data write to the array to which data is to be written back has been requested. If the result of the determination in step 302 is negative, the dirty data is transferred from the cache array 60 through the write back line 74 to the array to which data is to be written back, on a line-by-line basis at step 304, and the process passes to step 310. This processing corresponds to an operation of the write back controller according to this invention.

Figure 13:
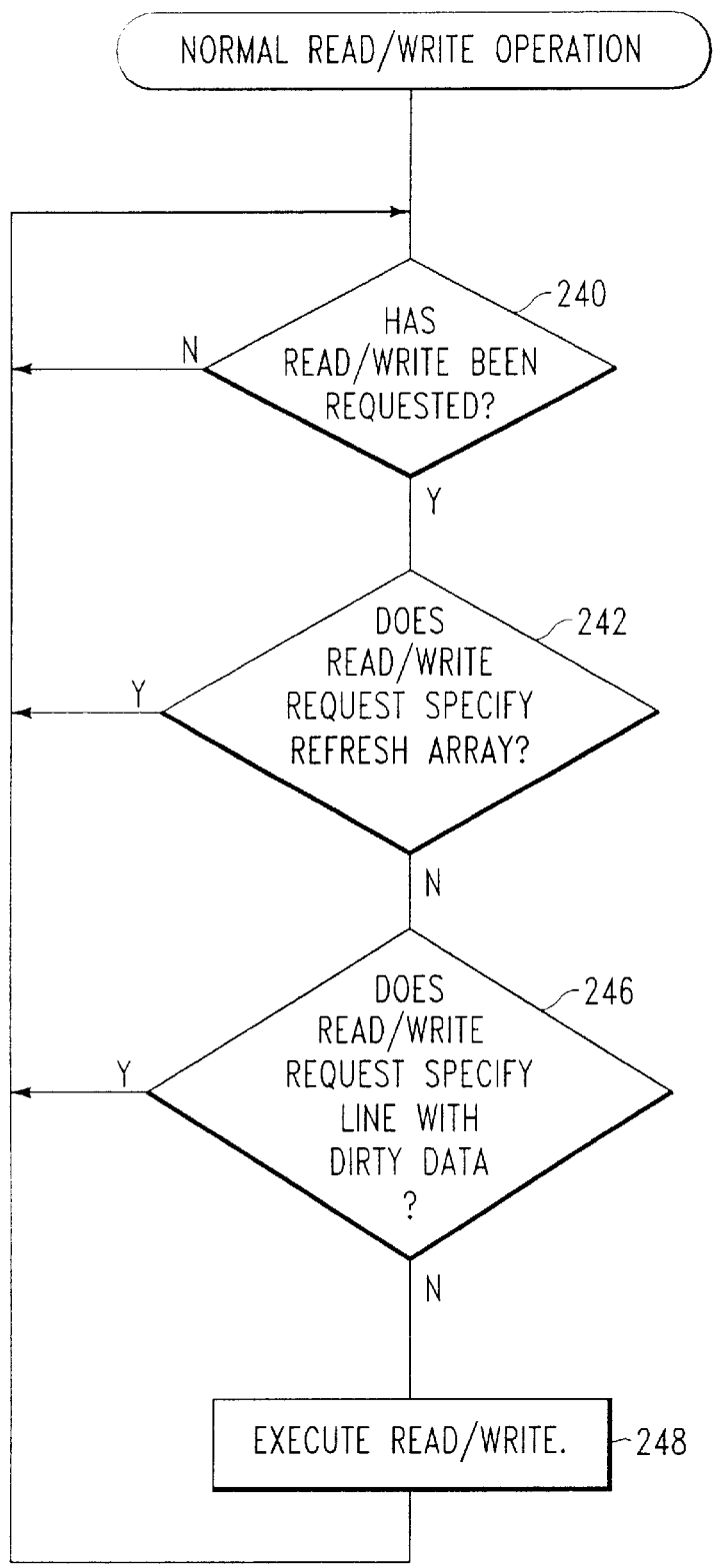
FIG. 13 is a flowchart showing a normal read/write operation performed by a controller.
Figure 18:
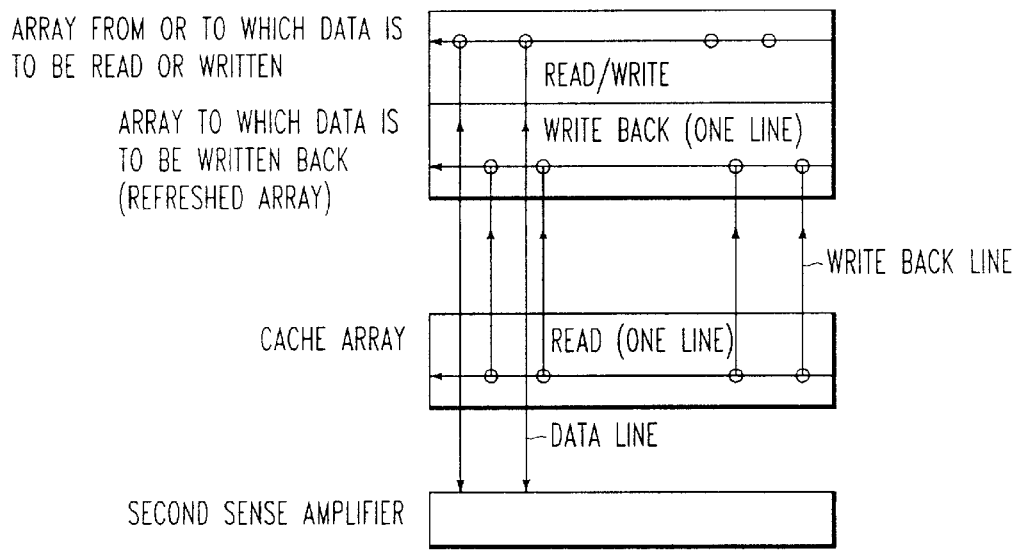
FIG. 18 is a schematic drawing describing the processing executed when there occurs a request for a data read from or a data write to an array that is different from the array to which data is written back.

Since at step 304, data is written back via the write back line 74, the "normal read/write operation" described in FIG. 13 is used to execute a data read from or a data write to an array other than the array to which data is to be written back, and the dirty data can be written back without creating a problem as shown in FIG. 18, even if the data line 56 is in use. In addition, in the above processing, that bit of the register B 86 which corresponds to the line to which data has been written back is set (for example, its value is set to "0").

If a data read from or a data write to the array to which data is to be written back has been requested, the result of the determination in step 302 is positive, and the process proceeds to step 306 to determine whether or not the data read or write request specifies a line with dirty data. If the result of the determination is negative, the processing is finished without writing back dirty data.

If a data read has been requested, the "normal read/write operation" described in FIG. 13 is used to execute a data read from the array to which data is to be written back, as shown in "Read Clean" in FIG. 19(A), whereas if a data write has been requested, the "normal read/write operation" described in FIG. 13 is used to execute a data write to the array to which data is to be written back, as shown in "Write Clean" in FIG. 19(C).

In addition, if the request for a data read from or a data write to an object to which data is to be written back specifies a line with dirty data, the result of the determination in step 306 is positive, and the process passes to step 308. The process then executes a data read from or a data write to the line with dirty data stored in the cache array 60 (the processing corresponding to an operation of the read/write controller according to this invention), writes back the dirty data to the array to which the data is to be written back, on a line-by-line basis (the processing corresponding to an operation of the write back controller according to this invention), and resets that bit for the line of the register B 86 to which the data has been written back (for example, sets its value to "0"). The process then proceeds to step 310.

In particular, if a data read has been requested, a single line of dirty data including data to be read is read from the cache array 60, only the data to be read is transferred to the external destination via the second sense amplifier 76, and the dirty data read from the cache array 60 is written back to the array to which data is to be written back, as shown in "Read Dirty" in FIG. 19(B). If a data write has been requested, a single line of dirty data stored in the cache array 60 is partly rewritten with externally transferred write data, and the partly rewritten dirty data is written to the cache array 60, as shown in "write Dirty" in FIG. 19(D).

Of course, the access time for an external read or write request in any of "Read Clean", "Write Clean", "Read Dirty", and "Write Dirty" described above is constant and short regardless of the size of read or write data.

At step 310, the process determines whether or not any dirty data is present in the cache array 60, based on whether or not there is any set bit in the register B 86 (for example, the value of any bit is set to "1"). If the result of the determination is positive, the operation is finished, the above operation is repeated during the subsequent cycle. If the result is negative, the write back request is cleared to finish the operation at step 312.

In the above write back processing, if a data read from or a data write to a non-dirty-data line of the array to which data is to be written back is requested, the dirty data is not be written back. Thus, when there are continuous requests for data reads from or data writes to a non-dirty-data line of the array to which data is to be written back, a refresh request may be issued to the next DRAM array 22 before a write back to the array to which the data is to be written back has been completed.

Until a write back operation has been completed, the dirty data remains stored in the cache array 60, so the cache array 60 cannot be used to refresh the next array to be refreshed. Consequently, in the refreshing operation shown in FIG. 14, if a data read from or a data write to the array to be refreshed has been requested and the write back request has not been cleared (the write back operation has not been completed), the result of the determination in step 270 is positive, and the array to be refreshed is not be refreshed.

Figure 20:
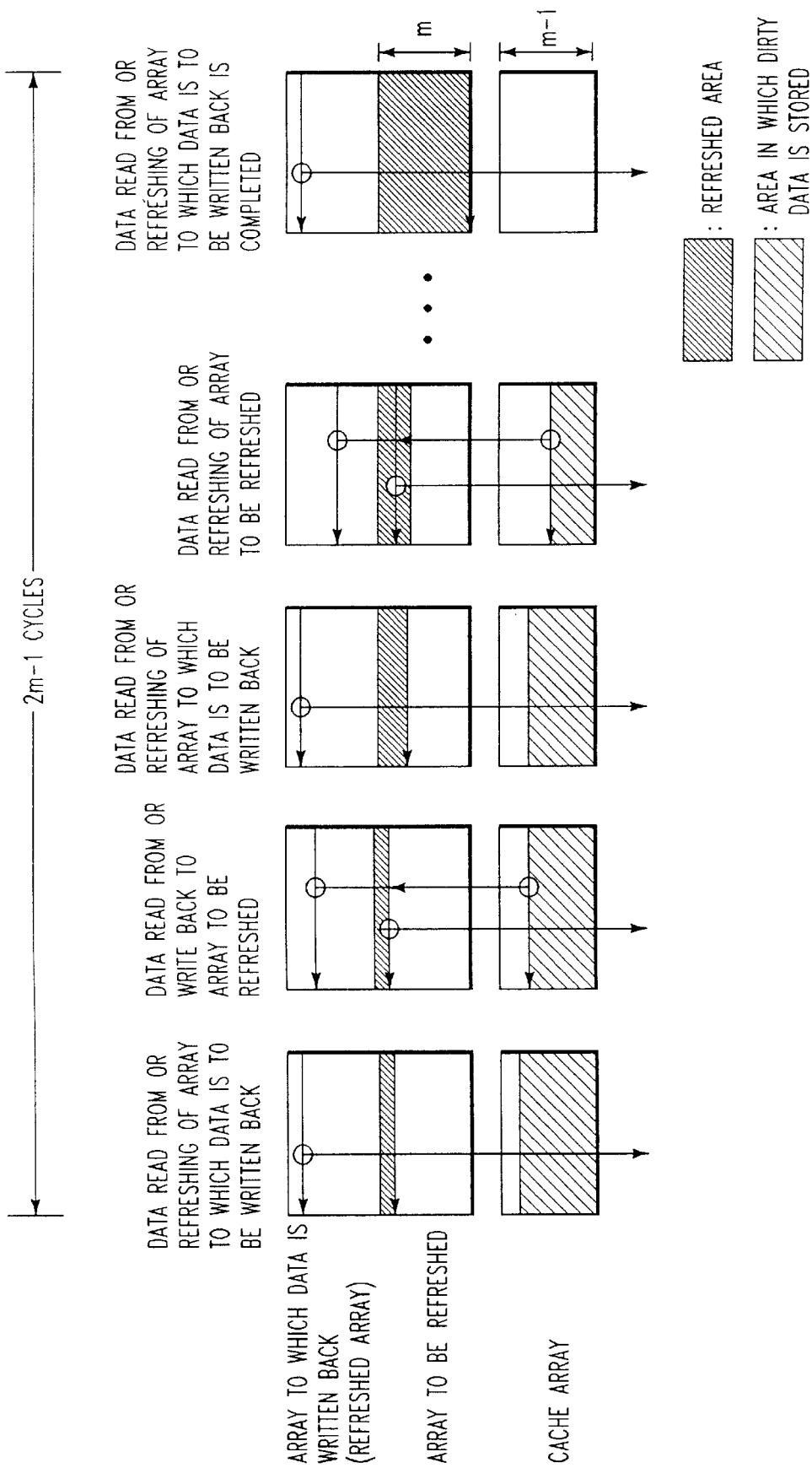
FIG. 20 is a schematic drawing showing one example of a process pattern executed when a refresh request is issued prior to the initiation of a write back operation and a write back of dirty data and refreshing are thus executed in parallel.
Figure 21C:
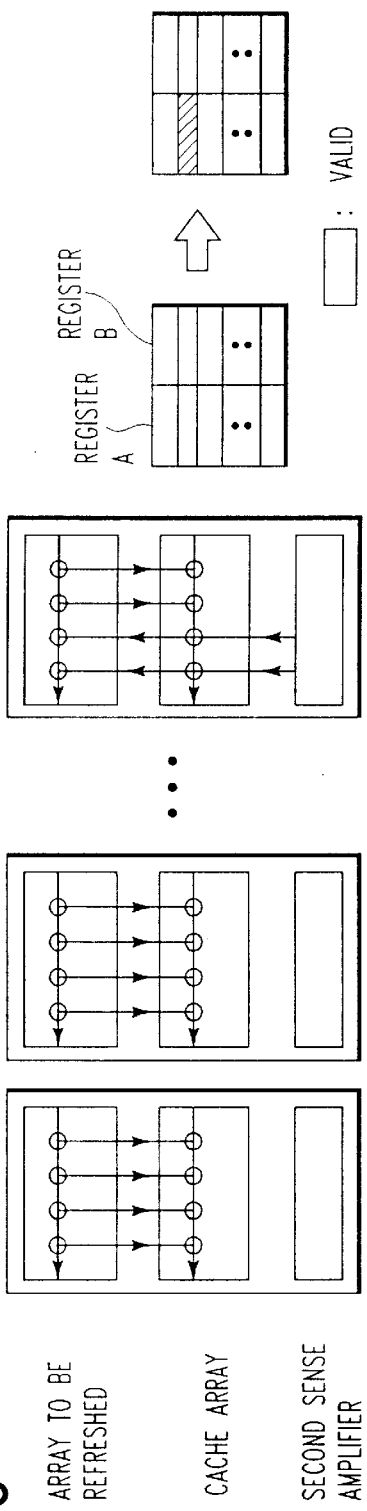
Figure 21D:
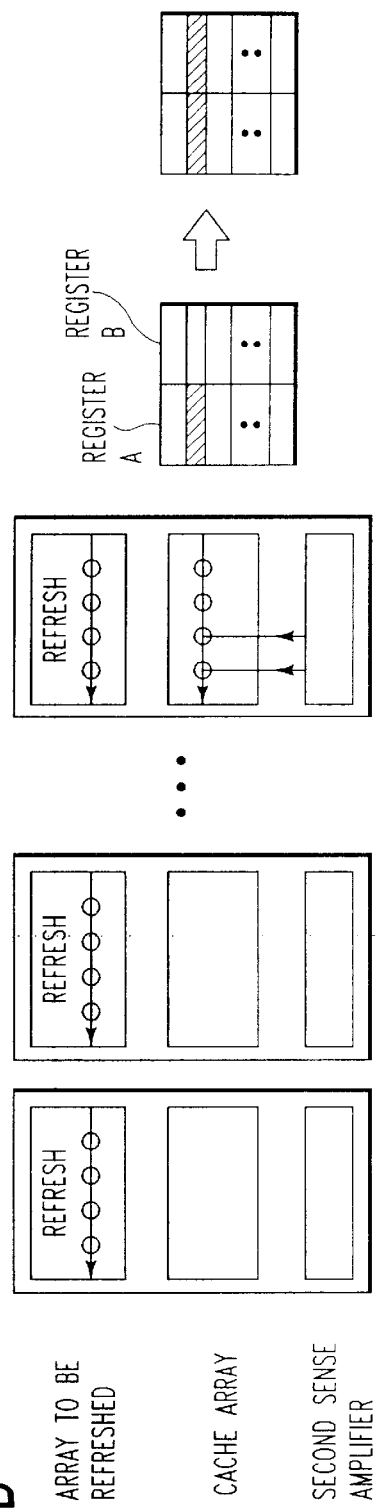

In this case, however, as shown in FIG. 20, if a data read from or a data write to a non-dirty-data line of the array to which data is to be written back is requested, the array to be refreshed can be refreshed while a data read from or a data write to (in FIG. 20, a data read) the array to which data is written back is being carried out. On the other hand, if a data read from or a data write to the array to be refreshed is requested, the dirty data can be written back to the array to which data is to be written back while a data read from or a data write to (in FIG. 20, a data read) the array to be refreshed is being carried out.

Thus, if there are continuous requests for reads from or writes to a non-dirty-data line of the array to which data is written back, the dirty data cannot be written back but the refreshing of the array to be refreshed can be completed in (m) cycles without using the cache array 60. In addition, if there are continuous requests for reads from or writes to the same line of the array to be refreshed (for example, in the case of a page mode), the array to be refreshed cannot be refreshed but the write back of the dirty data can be completed in m−1 cycles at maximum (if m−1 dirty data are held in the cache array 60). In this case, once the write back of the dirty data has been completed, the cache array 60 is relieved to enable the use of it to perform a refreshing operation.

Figure 10B:
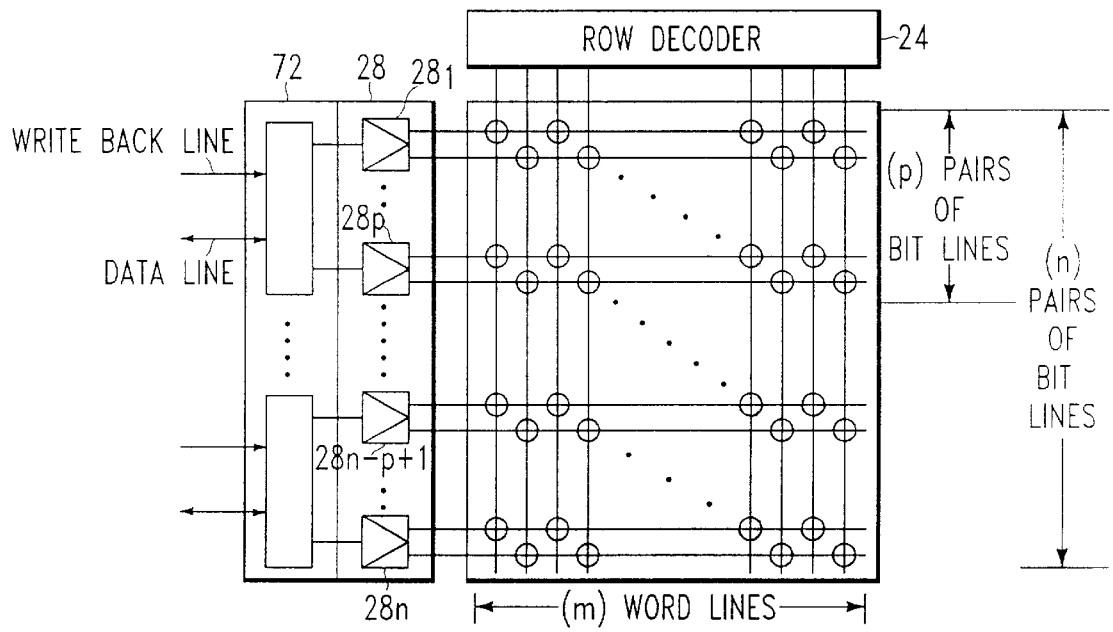
FIG. 10(B) is a schematic block diagram showing one example of the configuration of bit switches wherein the number of switches is smaller than (n) indicating the number of the pairs of bit lines.

Although the above embodiment has been described in conjunction with the bit switch 72 including the (n) switches 72$_1$ to 72$_n$ corresponding to the (n) pairs of bit lines, this configuration requires (n) data lines 56 and (n) write back lines 74 to be connected to the bit switch 72, resulting in difficult wiring. Thus, a single switch may be provided for every (p) pairs of bit lines as the bit switch 72 with (p) sense amplifiers 28 connected to each switch, as shown in FIG. 10(B). This configuration requires only n/p data lines 56 and n/p write back lines 74 to be connected to the bit switch 72, resulting in simple wiring.

If, however, a single switch is provided for every (p) pairs of bit lines, and if only a single register A 84 and a single register B 86 are provided as described in the above embodiment, (p) accesses to the DRAM array 22 are required to copy a line of data to the cache array 60. To reduce the number of accesses to the DRAM array, (p) registers A 84 and (p) registers B 86 may be provided. As a result, upon the arrival of the time to execute refreshing, the refreshing of the line to be refreshed can be omitted if at least one of those bits of the (p) registers A 84 which each correspond to this line is set (its value is set to "1").

In addition, although the above embodiment has been described in conjunction with the cache array 60 comprising SRAM arrays, this invention is not limited to this aspect, but the cache array 60 may comprise DRAM arrays. In this case, if between the point of time the refreshing of a specified DRAM array 22 is completed and the arrival of the next time to refresh this specified DRAM array, the dirty data to be written back to the specified DRAM array remains in the DRAM array as the cache array (the DRAM cache array), the DRAM cache array must be refreshed prior to the refreshing of the specified DRAM array (the array to which data is to be written back). The refreshing operation described in the above embodiment may then be applied by using the DRAM cache array as the array to be refreshed and the array to which data is to be written back as the cache array. In this case, however, refreshing may be applied to the line storing the dirty data.

Specifically, if there is a request for a read from or a write to a DRAM array 22 other than the array to which data is to be written back, then the DRAM cache array is refreshed (or the dirty data is written back) while data is being read from or written to the DRAM array 22. If there is a request for a read from or a write to the array to which data is to be written back, and if the data to be read from or written to is not stored in the DRAM cache array, then the DRAM cache array is refreshed while data is being read from or written to the array to which data is to be written back.

If there is a request for a read from or a write to the array to which data is to be written back, and if the data to be read from or written to is dirty and stored only in the DRAM cache array, then the DRAM cache array and the array to which data is to be written back can be used as the array to be refreshed and the cache array, respectively, to apply "Read Miss", "Write Thou", or "Write Miss" in order to write back the dirty data stored in the DRAM cache array.

Furthermore, in the above embodiment, the refreshing of each single DRAM array 22 has been executed. This invention, however, is not limited to this aspect, and the DRAM array 22 may be divided into a plurality of groups each comprising a plurality of DRAM arrays 22, and as many cache arrays as the DRAM arrays 22 constituting a single group may be provided to enable each group of DRAM arrays to be collectively refreshed, as shown in FIGS. 21(A) to (D). In this case, by copying data to the cache memory or writing back data from the cache memory to the DRAM array on the basis of the data in the lines of the same row address within a plurality of DRAM arrays constituting a single group, the need to increase the number of registers A and B is eliminated to enable the size of the circuit to be reduced and to simplify control.

If a data write back is carried out on the basis of the data in the lines of the same row address within a plurality of DRAM arrays constituting a single group as described above, data is written back to those DRAM arrays which do not require a write back, resulting in wasteful power consumption. Since, however, each group is collectively refreshed in the above embodiment, the number of required refreshing operations for the number of access to the DRAM array is smaller than when refreshing is executed on a single DRAM array basis, and the probability of the occurrence of dirty data is reduced, resulting in only a small increase in power consumption.

In addition, although in the above embodiment, the register B 86 has been provided to determine whether or not dirty data is present on the cache array 60, the register B 86 is not essential and may be omitted. In this case, during the refreshing operation, the register A 84 is not cleared even when the refreshing of the array to be refreshed has been completed, while during the write back operation, data may be written back to all the lines (the lines the data in which has been copied to the cache array 60) corresponding to set bits of the register A 84 (for example, their values have been set to "1").

Furthermore, although the above embodiment includes the refresh counter 82 for enabling the inside of the storage device 90 to manage the arrival of the time to execute refreshing, this invention is not limited to this aspect, and the time to carry out refreshing may be externally managed so as to detect that the time has come to execute refreshing, based on external signals (for example, the refresh clock signal Refresh-CLK described in the first embodiment).

The following is a validation showing that existing DRAM arrays may be applied as the DRAM arrays 22 for the storage device 90 which have been explained in the second embodiment, without creating a problem.

Suppose that the RAS cycle time of the storage device 90 (the shortest cycle time required for an access (a read or write)) is referred to as $t_{RC}$, that the total number of the lines of the DRAM arrays 22 of the storage device 90 (the number of DRAM arrays multiplied by the number of lines per a single array (m)) is referred to as (q), and that the refresh cycle time for a single line of the DRAM array is referred to as $t_{RET}$. Then, it is only necessary that a single line can be refreshed at least within $r = t_{RET}/(q \times t_{RC})$ accesses. Since there are m lines for each array, it would be sufficient to refresh one array in at least rm accesses.

Figure 22:
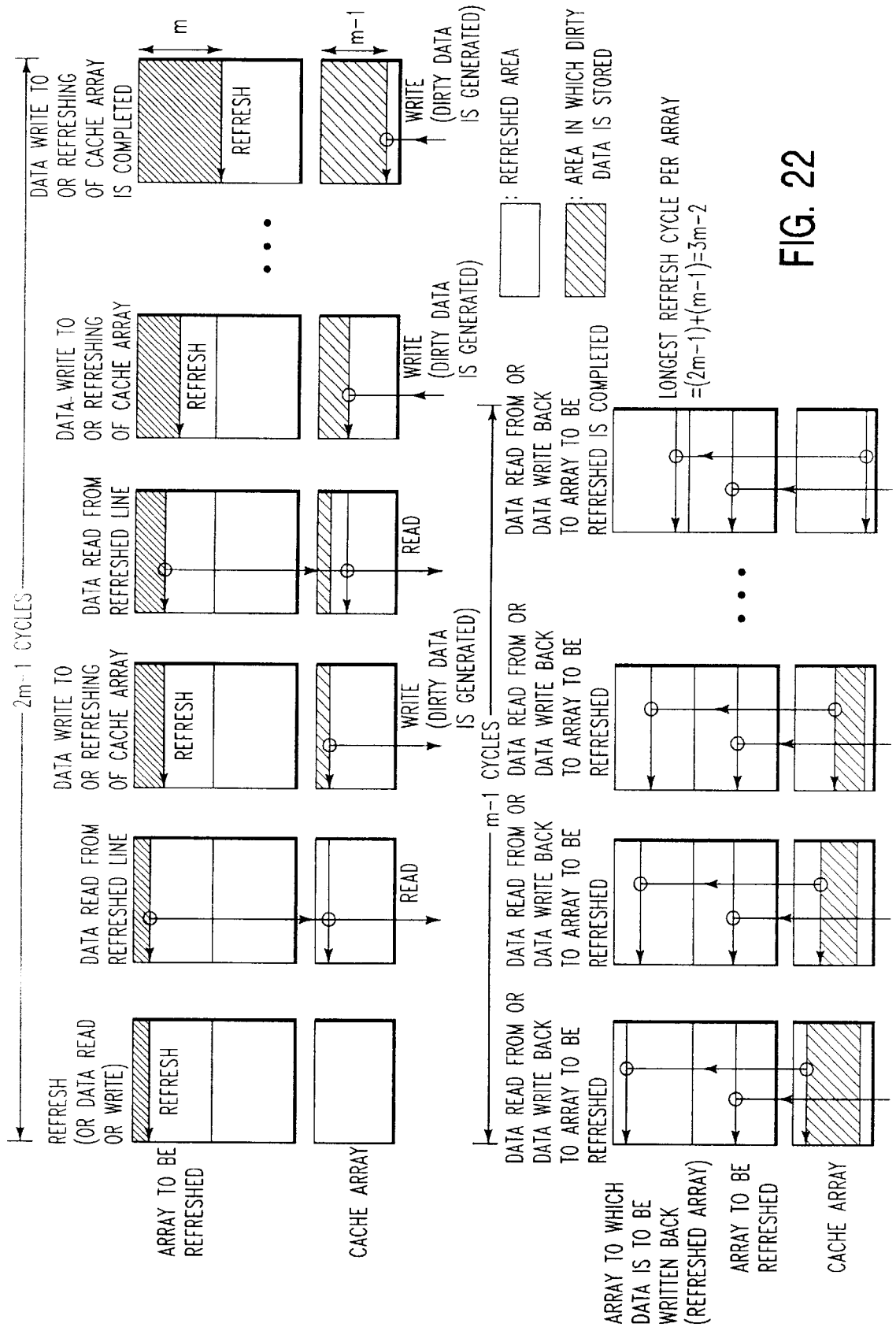
FIG. 22 is a schematic drawing showing a process pattern in which the refresh cycle per array is longest.
Figure 23:
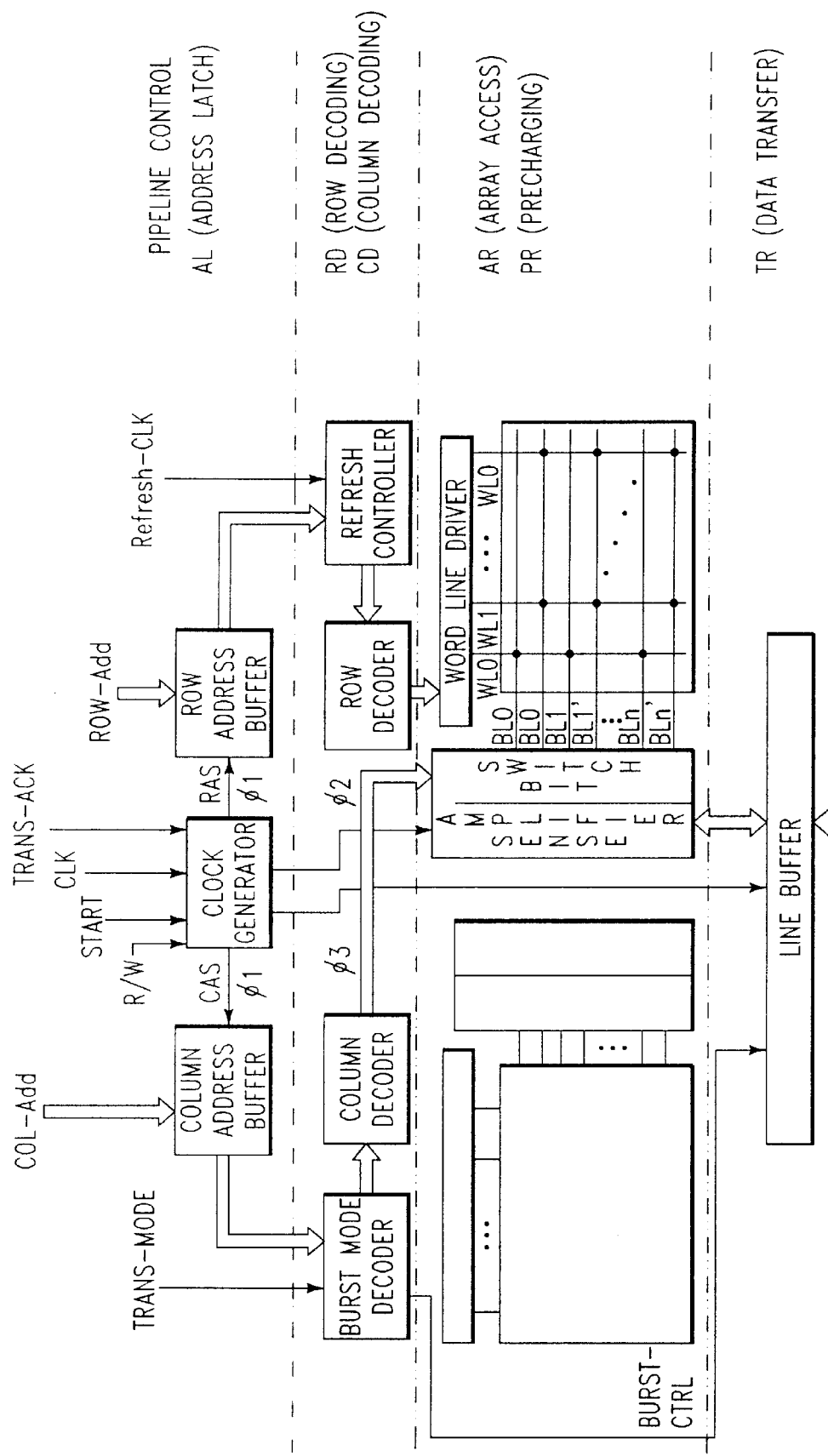
FIG. 23 is a block diagram showing an approximate configuration of a storage device previously proposed by the applicant and shown as an example of the prior art of this invention.
Figure 24:
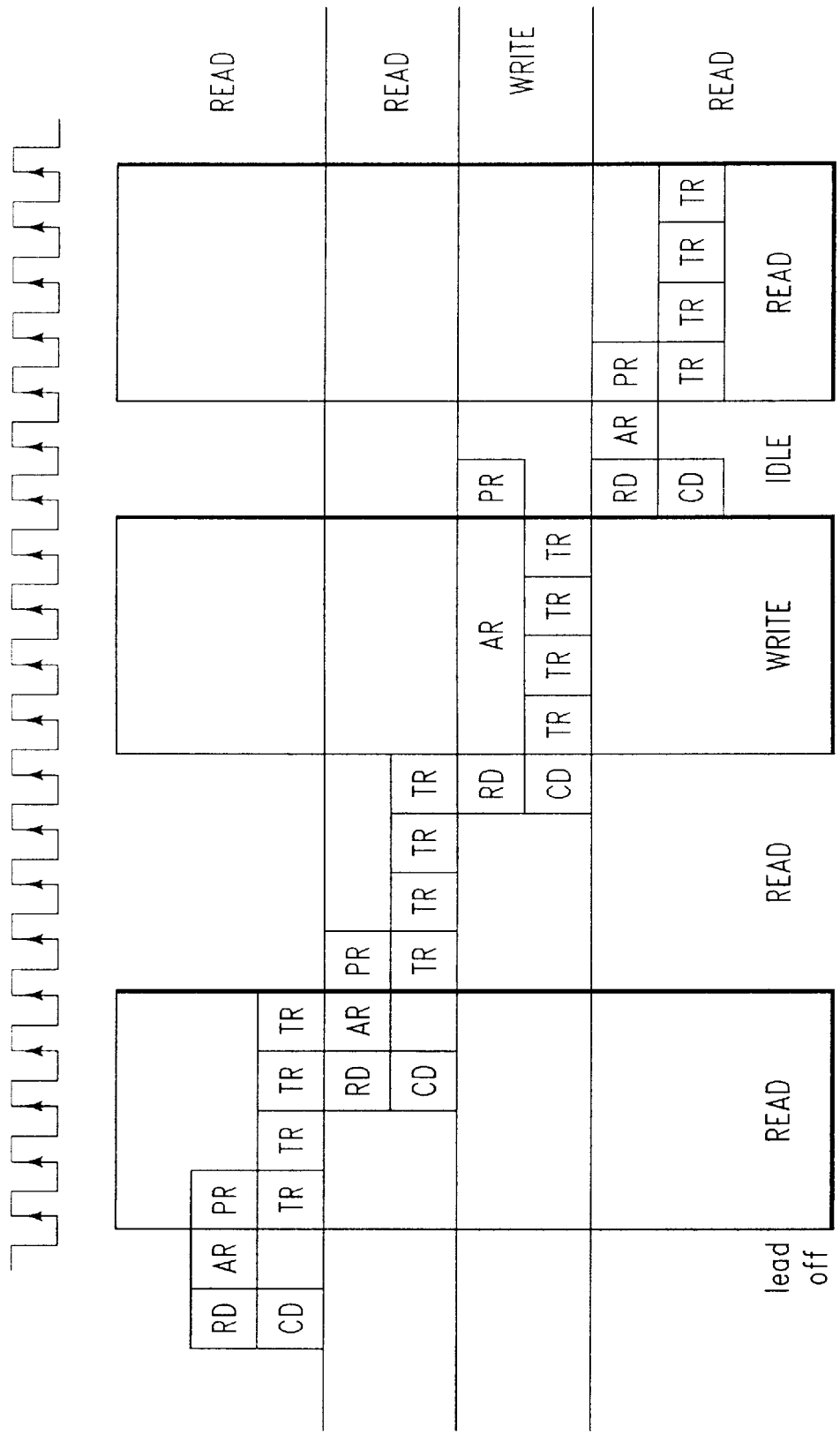
FIG. 24 is a timing chart showing the processing executed by the storage device shown in FIG. 23 when a write and a read requests are continuously input after the execution of a data read.

In the storage device 90 described in the second embodiment, the longest refresh cycle time per array is 3m−2 cycles. That is, the longest refresh cycle time per array is required when the following operations are performed as shown in FIG. 22:

1. The refreshing of a first line of the array to be refreshed is executed.
2. A data read from the line refreshed during the preceding cycle is then requested. A data read from this line is executed and the data in this line is copied to the cache array 60.
3. A data write to the data in the line copied to the line copied to the cache array 60 during the preceding cycle is then requested. A data write to the cache array is carried out (dirty data is generated), and the next line to be refreshed is refreshed.

The above 2. and 3. are alternatively repeated, so the refreshing of the array to be refreshed is completed in 2m−1 cycles, and m−1 dirty data are generated in the cache array 60. An access (in FIG. 22, the access is a data read, but may be a read or a write) to the same line of the array to be refreshed is continuously requested over subsequent cycles (during these cycles, the cache array 60 is not relieved, so the array to be refreshed cannot be refreshed), and m−1 dirty data on the cache array 60 are written back in m−1 cycles. The refreshing requires 2m−1 cycles and the write back of the dirty data requires m−1 cycles, so 3m−2 cycles are required in total.

In addition, as shown in FIG. 10(B), when one switch is provided for each of a pairs of bit lines, p times cycles are required for copy of data to the cache array 60, and write back to the dirty data of the DRAM array 22, respectively, so that the longest refresh cycle becomes (3m−2) cycles per array.

In addition, the refreshing of each line is normally executed in the order of the row address. As explained in the second embodiment, however, the refreshing of those lines of the array to be refreshed from or to which data has been read or written is omitted (as in FIGS. 16(A) and © and 17). Thus, if during a previous refreshing operation, a read from or a write to a line is executed first and its refreshing is omitted, the refreshing of this line may be carried out last during the subsequent refreshing operation. Consequently, exactly speaking, the refresh cycle time $t_{RET}$ is equal to $t_{RET} - p(2m-1) \times t_{RC}$, but this is negligible because $t_{RET} \gg p(2m-1) \times t_{RC}$.

Furthermore, if the cache array 60 comprises a DRAM array, this DRAM cache array must be refreshed, and the refreshing of the DRAM cache array also requires p (3m−2) cycles at maximum to copy data to the DRAM array. This, however, is also negligible because this refreshing serves to complete the refreshing of the DRAM array used as the cache array except for one line.

As a result, it is only necessary that the time required to complete the longest refresh cycle p (3m−2) per array is shorter than the time required for rm accesses, that is, the following equations are satisfied.

[Equation 1]

$$rm - p(3m-2) > 0, \text{ that is, } r > 3p - 2p/m \quad (1)$$

In the above equation, 2p/m is a positive integral, so the omission of the second term in the right side of Equation (1) simply results in a more rigid condition and creates no problem. Thus, only the following inequality must be met.

$$r > 3p$$

If a mathematical operation is performed using conditions that are considered suitable as a specification of a 256M bit DRAM array, that is, RAS cycle time $t_{RC}=70$ ns, refresh cycle time $T_{RET}=64$ ms, q=8k, and p=32, then r=111>3p=96, which meets the above condition. Therefore, it is evident that there will be no problem if a DRAM array of a capacity of about 256M bits is used as the DRAM array 22 of the storage device 90.

As described above, the present invention has an excellent advantage that reads or writes of a specified size of data comprising a plurality of unit data can be executed in a constant and short access time regardless of the timing with which the data reads or writes are carried out.

In addition to the above advantages, the present invention has an advantage that even if a data write request is followed by a data read request, the timing with which the transfer of read data is initiated in response to this external data read request is not delayed.

In addition to the above advantages, the present invention has an advantage that read data is consistent even if data writes to or data reads from the same address are continuously requested.

The present invention also has an excellent advantage that reads or writes of unit data as well as a specified size of data comprising a plurality of unit data can be executed in a constant and short access time regardless of the timing with which the data reads or writes are carried out.

In addition to the above advantages, the present invention has an advantage that the probability that the data corresponding to that specified area of the DRAM array which is specified by a data read or write request is stored in the storage means is improved without increasing the number of accesses to the DRAM array, and in that it is easy to determine whether or not the data corresponding to that specified area of the DRAM array which is specified by a data read or write request is stored in the storage means.

In addition to the foregoing advantages, the present invention has an advantage that data can be written back from the storage means to the DRAM array even if the signal line for transferring data read from the DRAM array or written thereto is occupied.

In addition to the above advantages, the present invention has an advantage that the amount of those data stored in the storage means which do not match the corresponding data stored in the DRAM array is reduced.

In addition to the above advantages, the present invention has an advantage that wasteful power consumption can be reduced, and in that the refreshing of the DRAM array can be completed in a shorter period of time.

In addition to the above advantages, the present invention has an advantage that a write back of data from the storage means to the DRAM array can be completed in a shorter period of time.

In addition to the above advantages, the present invention has an advantage that even if the time has come to refresh a DRAM array that is different from the DRAM array to which data is to be written back before the write back to the latter DRAM array has been finished, the DRAM array to be refreshed can be reliably refreshed.

In addition to the above advantages, the present invention has an advantage that the refreshing of the storage means can be reliably carried out if it comprises a DRAM array.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A memory system comprising:
   a DRAM array having a plurality of DRAM cells each of said DRAM cells connected to a bit line;
   a data buffer;
   a read/write controller for in response to a read request specifying a first address area of said DRAM array, reading data composed of a plurality of unit data from said first address area via said bit line, and storing the read data into said data buffer, and sending out said data from said data buffer, and for, in response to a write request specifying a second address area of said DRAM array, storing data composed of a plurality of unit data for said second address area into said data buffer from the outside, and writing said data which has been stored in said data buffer into said second address area of said DRAM array via said bit line, and for scheduling the writing and reading for said DRAM array so that the writing and reading do not overlap with a precharge for said bit line; and
   a refresh controller for scheduling a refresh for said DRAM array and a precharge for said bit line so that the writing and reading and said precharge by said read/write controller do not overlap with said refresh and said precharge for said bit line.

2. The memory system of claim 1 wherein the refresh controller sequentially refreshes each area of the DRAM array, the refresh controller immediately refreshes a specified area of the DRAM array to be refreshed and precharges the bit line if the read/write controller does not carry out a data read from and any data write to the DRAM array and does not precharge the bit line within a predetermined period of time at an arrival of time to refresh the DRAM array time, and if the read/write controller carry out at least one of the data read from and the data write to the DRAM array or precharge the bit line within said predetermined period of time, said refresh controller holds an address of said specified area and in response to a situation in which the read/write controller does not carry out any data read from and any data write to the DRAM array and does not precharge the bit line, the refresh controller refreshes said specified area and precharges the bit line according to said held address.

3. The memory system of claim 2 wherein the data buffer includes a read and a write buffer so that when a data write is carried out, the read/write controller saves in an address buffer the addresses of an area to which the data is written and holds in the data buffer write data sequentially transferred from an external source on a unit data basis and if a data read is externally requested at the same time when or before the transfer of write data from the external source is completed, the data is read from the DRAM array and held in said read buffer, and while read data is being sequentially transferred to the external destination on a unit data basis or when the next request is a data write, said write data is written to the DRAM array based on the addresses saved in said address buffer.

4. The memory system of claim 3 wherein the read/write controller includes a data transfer section and an address decode section for transferring data between the data buffer and an external device the data transfer section and the address decode section operate in parallel so that both the read/write controller and the refresh controller use the same address decode section for decoding the addresses of an area from or to which data is read or written or which is to be refreshed and the same array access section for reading or writing data from or to the specified area of the DRAM array corresponding to addresses of an area from or to which data is read or written or which is to be refreshed and the same array access section for reading or writing data from or to the specified area of the DRAM array corresponding to the addresses decoded by said address decode section, refreshing the specified area, or precharging the bit line of the DRAM array.

5. A memory system comprising:
   a plurality of DRAM cells;
   a storage means for temporarily storing data having a number of storage cells;
   a refresh controller operative upon the arrival of the time to refresh the DRAM array for refreshing the DRAM array while data is not being read from or written, to the DRAM array;
   a read/write controller operative upon an external request for a data read from or a data write to a specified area of the DRAM array being refreshed by the refresh controller, for reading data from a specified area of the DRAM array, transferring to an external destination the data read from the specified area, and storing it in the storage means, or using write data transferred from the external source to rewrite the data read front the specified area and storing the rewritten data in the storage means if the data corresponding to the specified area of the DRAM array is not stored in the storage means, and if the data corresponding to the specified area of the DRAM array is stored in the storage means, executing a read or a write of the data stored in the storage means and corresponding to the specified area; and
   a write back controller for writing back the data stored in the storage means to the corresponding area of the DRAM array after the refreshing of the DRAM array by the refresh controller has been completed.

6. The memory system according to claim 5 in which the number of storage cells in the storage means constitute a single storage cell column which is the same as the number of DRAM cells in a single DRAM cell column of the DRAM array.

7. The memory system according to claim 6 in which the refresh controller sequentially refreshes each of the plurality of DRAM arrays.

8. The memory system of claim 7 in which if an external request for a data write to a specified area of the DRAM array being refreshed by the refresh controller and the data corresponding to the specified area of the DRAM array is not stored in the storage means, then the data is read from the specified area of the DRAM array by the read/write controller and the data read from the specified area is rewritten using write data transferred from the external source in order to store the rewritten data in the storage means and to write it to the specified area of the DRAM array.

9. The memory system according to claim 7 in which if a request for a data read from or a data write to a specified area of the DRAM array being refreshed by the refresh controller is received, the read/write controller can determine whether or not the data corresponding to the specified area is stored in the storage means.

10. The memory system of claim 7 wherein if the read/write controller has read or written data from or to the DRAM array being refreshed by the refresh controller wherein the read/write controller stores a first identification information for identifying that area of the DRAM array from or to which data has been read or written to determine whether or not the data in the specified area to which the read or write has been executed is stored in the storage means based on the first identification information.

11. The memory system of claim 10 in which the write back controller can carry out write backs of all the data stored in the storage means, based on the first identification information, as a result of reads or writes by the read/write controller, and clear the first identification information after the completion of the write back.

12. The memory system of claim 7 further includes a plurality of DRAM arrays wherein the read/write controller may read or write data from or to one DRAM array while refreshing another DRAM array.

13. The memory system of claim 7 in which, if the refresh controller and the read/write controller attempt with the same timing to refresh the specified area of the DRAM array and to carry out a data read or write, respectively, then the read/write controller reads or writes data from or to the specified area of the DRAM array, and the refresh controller omits the refreshing of the specified area of the DRAM array.

14. The memory system of claim 13 characterized in that if said read/write controller has executed a write only to data stored in said storage means, it stores a second identification information for identifying contaminated data occurring due to said write wherein the write back controller writes back contaminated data based on the second identification information.

15. The memory system of claim 14 characterized in that after writing back the contaminated data based on said second identification information, said write back controller clears said second identification information.

16. The memory system of claim 12, further including a write back line for writing back data from said storage means to said DRAM array wherein if the read/write controller is reading or writing data from or to a DRAM array that is different from the DRAM array to which data is to be written back, the write back controller uses the write back line to execute a write back to the DRAM array to which data is to be written back.

17. The memory system according to claim 7 wherein if the data corresponding to an area of the DRAM array which has been specified by a data write request is stored in the storage means as the data to be written back by the write back controller, the read/write controller executes a write to the data to be written back which is stored in the storage means, and the write back controller writes back the data to be written back on which the write has been executed by the read/write controller, from the storage means to the DRAM array in the same cycle in which the read/write controller writes the data.

18. The memory system of claim 17 wherein the storage means comprises SRAMs.

* * * * *